(12) United States Patent
Dejima et al.

(10) Patent No.: US 12,413,040 B2
(45) Date of Patent: Sep. 9, 2025

(54) LASER LIGHT SOURCE

(71) Applicant: NICHIA CORPORATION, Anan (JP)

(72) Inventors: Norihiro Dejima, Yokohama (JP);
Hideaki Takeda, Kawasaki (JP);
Hidenori Matsuo, Hadano (JP);
Masaki Omori, Toshima-ku (JP)

(73) Assignee: NICHIA CORPORATION, Anan (JP)

( * ) Notice: Subject to any disclaimer, the term of this patent is extended or adjusted under 35 U.S.C. 154(b) by 700 days.

(21) Appl. No.: 17/788,808

(22) PCT Filed: Sep. 8, 2020

(86) PCT No.: PCT/JP2020/033897
§ 371 (c)(1),
(2) Date: Jun. 24, 2022

(87) PCT Pub. No.: WO2021/131171
PCT Pub. Date: Jul. 1, 2021

(65) Prior Publication Data
US 2023/0031544 A1    Feb. 2, 2023

(30) Foreign Application Priority Data

Dec. 26, 2019 (JP) ................... 2019-236440
Jul. 2, 2020 (JP) ................... 2020-114674

(51) Int. Cl.
*H01S 5/02326* (2021.01)
*H01S 5/02253* (2021.01)
(Continued)

(52) U.S. Cl.
CPC ...... *H01S 5/02326* (2021.01); *H01S 5/02253* (2021.01); *H01S 5/02315* (2021.01); *H01S 5/02335* (2021.01); *H01S 5/0234* (2021.01)

(58) Field of Classification Search
CPC ............. H01S 5/02315; H01S 5/02415; H01S 5/02326; H01S 5/02253; H01S 5/0234
See application file for complete search history.

(56) References Cited

U.S. PATENT DOCUMENTS 5,770,821 A    6/1998 Hikasa et al.
2003/0048818 A1*  3/2003 Takeuchi ............ H01S 5/04252
                                                                    372/36

(Continued)

FOREIGN PATENT DOCUMENTS

JP    S57-094968 U    6/1982
JP    H04264789 A  *  9/1992
(Continued)

OTHER PUBLICATIONS

International Search Report with English translation and Written Opinion issued in the corresponding International Application No. PCT/JP2020/033897, dated Dec. 1, 2020.

*Primary Examiner* — Michael Carter
(74) *Attorney, Agent, or Firm* — Foley & Lardner LLP

(57) ABSTRACT

A laser light source includes: a laser diode chip including an emission layer, a substrate supporting the emission layer, and an emission end surface; a submount that includes a principal surface on which the laser diode chip is fixed and a pair of lens supports located at opposite sides with respect to the emission end surface of the laser diode chip; a lens bonded to the end surfaces of the pair of lens supports; and a semiconductor laser package housing the aforementioned elements. The laser diode chip is fixed to the submount with the emission layer being closer to the submount than is the substrate. The emission end surface of the laser diode chip is located outward with respect to an edge of the principal surface. The end surfaces of the pair of lens supports are located outward with respect to the first end surface of the laser diode chip.

14 Claims, 20 Drawing Sheets

(51) Int. Cl.
  *H01S 5/02315*  (2021.01)
  *H01S 5/02335*  (2021.01)
  *H01S 5/0234*  (2021.01)

(56)  References Cited

U.S. PATENT DOCUMENTS

| | | |
|---|---|---|
| 2003/0048819 A1 | 3/2003 | Nagano et al. |
| 2004/0027631 A1 | 2/2004 | Nagano et al. |
| 2005/0147149 A1* | 7/2005 | Fuse ................ H01S 5/02326 |
| | | 372/101 |
| 2008/0157347 A1 | 7/2008 | Takashima |
| 2011/0007762 A1 | 1/2011 | Fukuda et al. |
| 2011/0134948 A1 | 6/2011 | Kawakami et al. |
| 2014/0003062 A1 | 1/2014 | Yoshimura et al. |
| 2018/0090908 A1* | 3/2018 | Enzmann ............ H01S 5/02375 |
| 2018/0145479 A1* | 5/2018 | Nakamura .......... H01S 5/02315 |
| 2020/0136343 A1 | 4/2020 | Oomori et al. |
| 2021/0091532 A1 | 3/2021 | Miyata et al. |

FOREIGN PATENT DOCUMENTS

| | | |
|---|---|---|
| JP | H05-267794 A | 10/1993 |
| JP | H08-152549 A | 6/1996 |
| JP | H09-036274 A | 2/1997 |
| JP | 2000-098190 A | 4/2000 |
| JP | 2002-232064 A | 8/2002 |
| JP | 2002-368320 A | 12/2002 |
| JP | 2004-047650 A | 2/2004 |
| JP | 2004-047651 A | 2/2004 |
| JP | 2005-243659 A | 9/2005 |
| JP | 2008-166579 A | 7/2008 |
| JP | 2009-224382 A | 10/2009 |
| JP | 2010-073758 A | 4/2010 |
| JP | 2011-119521 A | 6/2011 |
| JP | 2014-006476 A | 1/2014 |
| JP | 2018-515916 A | 6/2018 |
| JP | 2019-062033 A | 4/2019 |
| JP | 2021-044468 A | 3/2021 |
| JP | 2021-052157 A | 4/2021 |
| WO | WO-2009/113180 A1 | 9/2009 |
| WO | WO-2019/009086 A1 | 1/2019 |

* cited by examiner

LASER LIGHT SOURCE

TECHNICAL FIELD

The present disclosure relates to a laser light source.

BACKGROUND ART

Laser light sources can be used for various applications, such as processing, projectors, and illumination devices. A typical example of such a laser light source may include a laser diode chip, a submount supporting the laser diode chip, and a collimating lens to reduce the divergence angle of laser light that is emitted from the laser diode chip (for example, Patent Document 1). In the case in which a laser diode chip, a submount, and a lens such as a collimating lens are housed in a semiconductor laser package, the laser light can be collimated or the like by a small lens before great divergence of the laser light occurs. On the other hand, even a slight misalignment between the laser diode chip and the lens may cause a great deviation in orientation of the optical axis of laser light that is emitted to the outside from the laser light source.

CITATION LIST

Patent Literature

[Patent Document 1] Japanese Patent Publication No. 2000-98190

SUMMARY OF INVENTION

Technical Problem

A laser light source is desired in which misalignment between a laser diode chip and a lens is unlikely to occur.

Solution to Problem

According to one embodiment of the present disclosure, a laser light source includes an edge-emitting type laser diode chip that includes: a semiconductor multilayer structure including an emission layer; a substrate supporting the semiconductor multilayer structure; a first end surface through which laser light generated in the emission layer is emitted; and a second end surface opposite to the first end surface, wherein a distance from the first end surface to the second end surface defines a cavity length; a submount having a principal surface on which the laser diode chip is fixed, wherein the submount includes a pair of lens supports located at opposite sides with respect to the first end surface of the laser diode chip and a back surface located opposite to the principal surface; a lens bonded to end surfaces of the pair of lens supports; and a semiconductor laser package housing the laser diode chip, the lens, and the submount, wherein, the laser diode chip is fixed to the submount with the emission layer being closer to the submount than is the substrate of the laser diode chip; the first end surface of the laser diode chip is located outward in a direction along the cavity length with respect to an edge of the principal surface; and the end surfaces of the pair of lens supports are located outward with respect to the first end surface of the laser diode chip in the direction along the cavity length.

Advantageous Effects of Invention

According to certain embodiments of the present disclosure, a laser light source can be realized in which a misalignment between a laser diode chip and a lens is unlikely to occur.

DESCRIPTION OF EMBODIMENTS

Figure 1A:
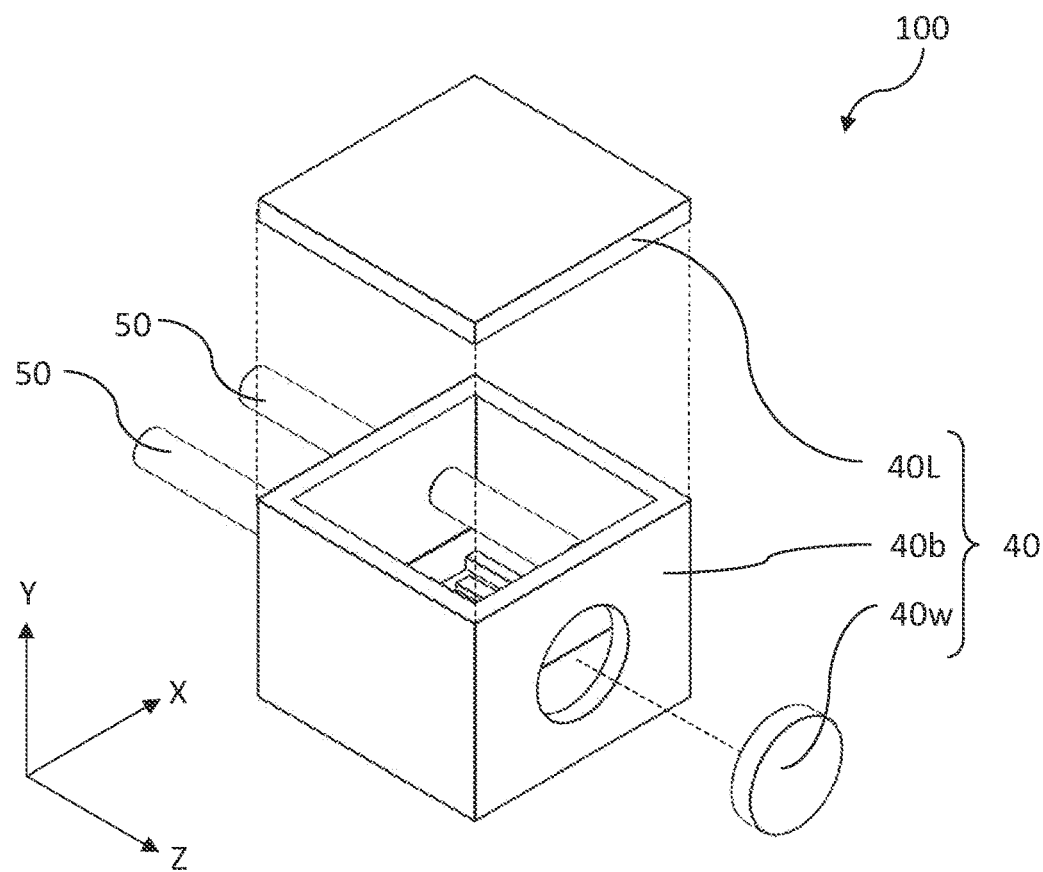
FIG. 1A is a perspective view schematically showing an example of a configuration of a laser light source 100 according to Embodiment 1 of the present disclosure.

Hereinafter, with reference to the drawings, laser light sources according to embodiments of the present disclosure will be described in detail. The same reference characters in a plurality of drawings denote the same or similar parts.

Moreover, while the description below is intended to give a concrete form to the technical ideas of the present disclosure; the present disclosure is not limited to the described embodiments. The dimensions, material, shape, relative arrangement, etc., of the components are intended as examples, and the scope of the present disclosure is not intended to be limited thereto. The size, arrangement relationship, etc., of the members shown in each drawing may be exaggerated in order to facilitate understanding.

Embodiment 1

First, with reference to FIG. 1A and FIG. 1B, and FIG. 2A to FIG. 2C, an example of a fundamental configuration of a laser light source according to Embodiment 1 of the present disclosure will be described.

Figure 1B:
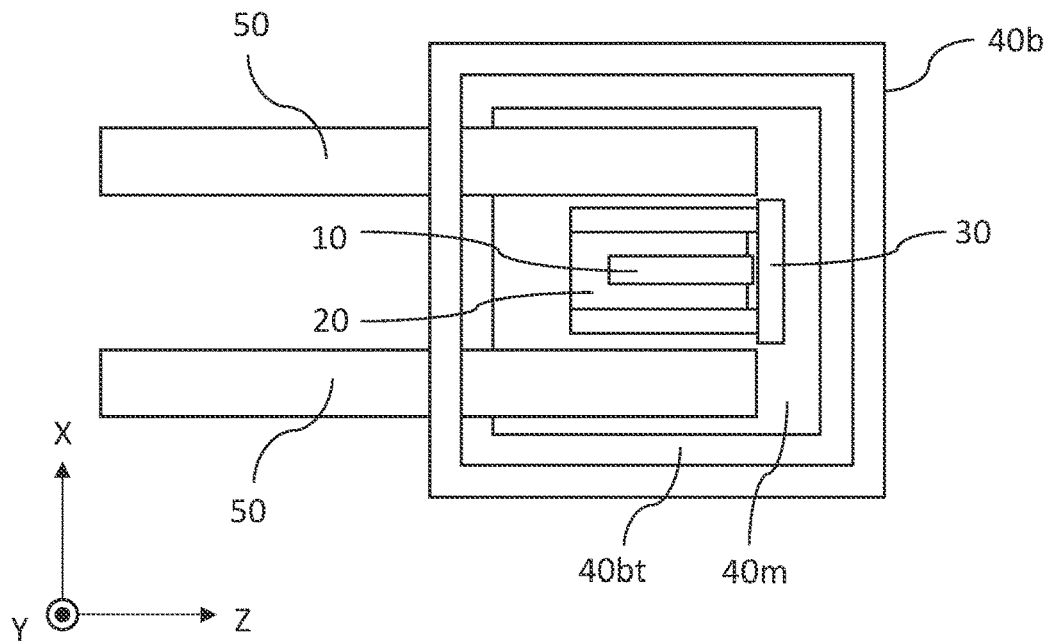
FIG. 1B is a diagram schematically showing a planar configuration of the laser light source 100 in FIG. 1A.

FIG. 1A is a perspective view schematically showing an example of a configuration of a laser light source 100 according to Embodiment 1 of the present disclosure. FIG. 1B is a diagram schematically showing a planar configuration of the laser light source 100 in FIG. 1A. The laser light source 100 of the present embodiment includes a laser diode chip 10, a submount 20 supporting the laser diode chip 10, a collimating lens 30 supported by the submount 20, and a semiconductor laser package 40 housing these elements or components. Moreover, the laser light source 100 of the present embodiment includes a pair of lead terminals 50 that penetrate the semiconductor laser package 40 and that supply power to the laser diode chip 10. The semiconductor laser package 40 includes a lid 40L, a base 40b, and a light-transmitting window 40w. In the laser light source 100 of the present embodiment, laser light that has been emitted from the laser diode chip 10 and collimated by the collimating lens 30 is extracted to the outside through the light-transmitting window 40w.

Although the lid 40L, the base 40b, and the light-transmitting window 40w of the semiconductor laser package 40 are shown isolated in FIG. 1A for ease of understanding, they are actually bonded to one another. In FIG. 1B, the lid 40L of the semiconductor laser package 40 is omitted from illustration.

In the figures, an X axis, a Y axis, and a Z axis that are orthogonal to one another are schematically shown for reference. For ease of understanding, in the present disclosure, a side at which the laser diode chip 10, the submount 20, and the collimating lens 30 are located in the base 40b may be indicated as an "upper" side. This does not restrict the orientation of the laser light source 100 in use; rather, the laser light source 100 may be oriented in any appropriate direction.

Figure 2A:
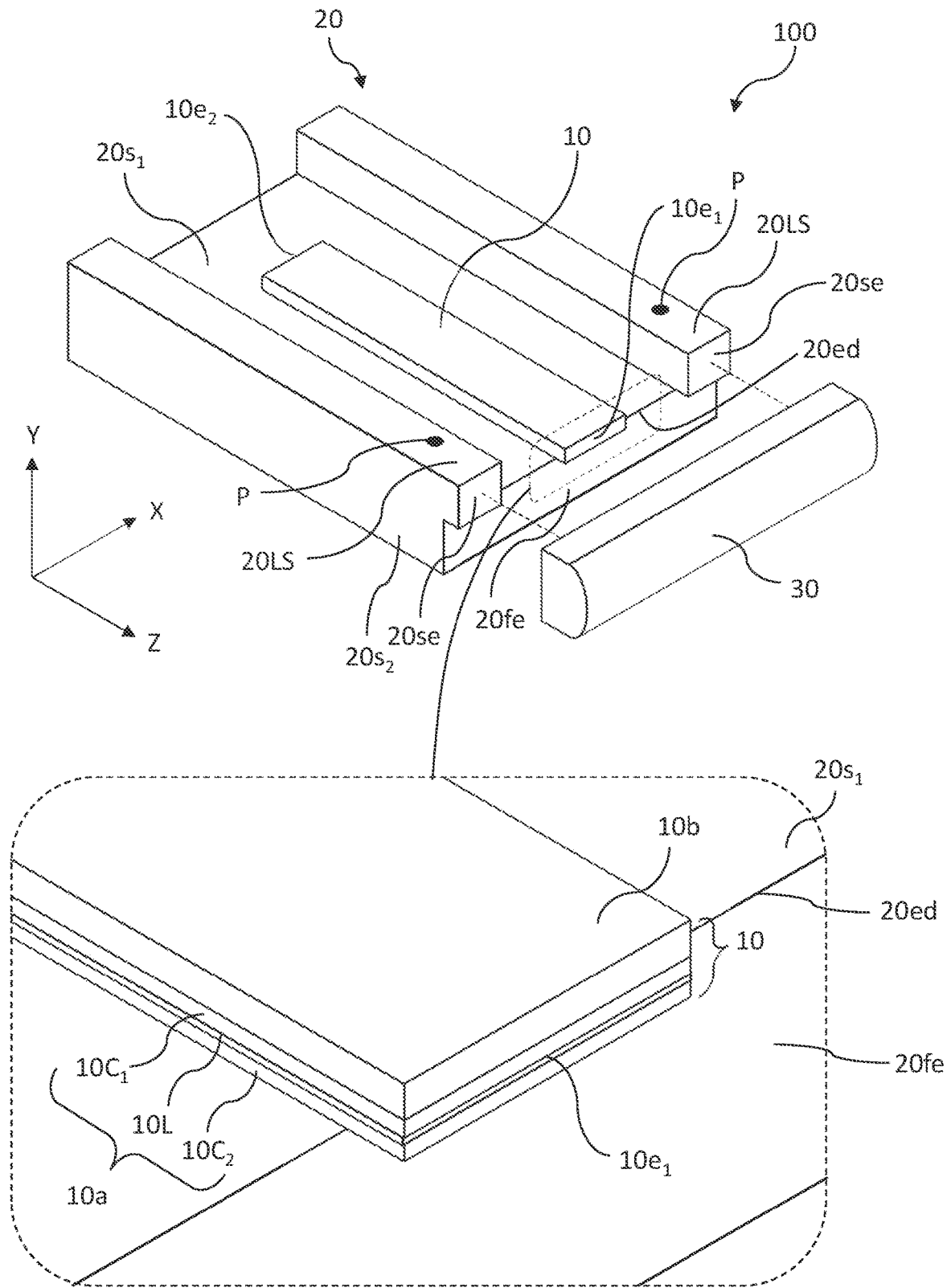
FIG. 2A is a perspective view showing in more detail the configuration of the laser light source 100 in FIG. 1A, in which a semiconductor laser package 40 and a pair of lead terminals 50 are not shown.
Figure 2B:
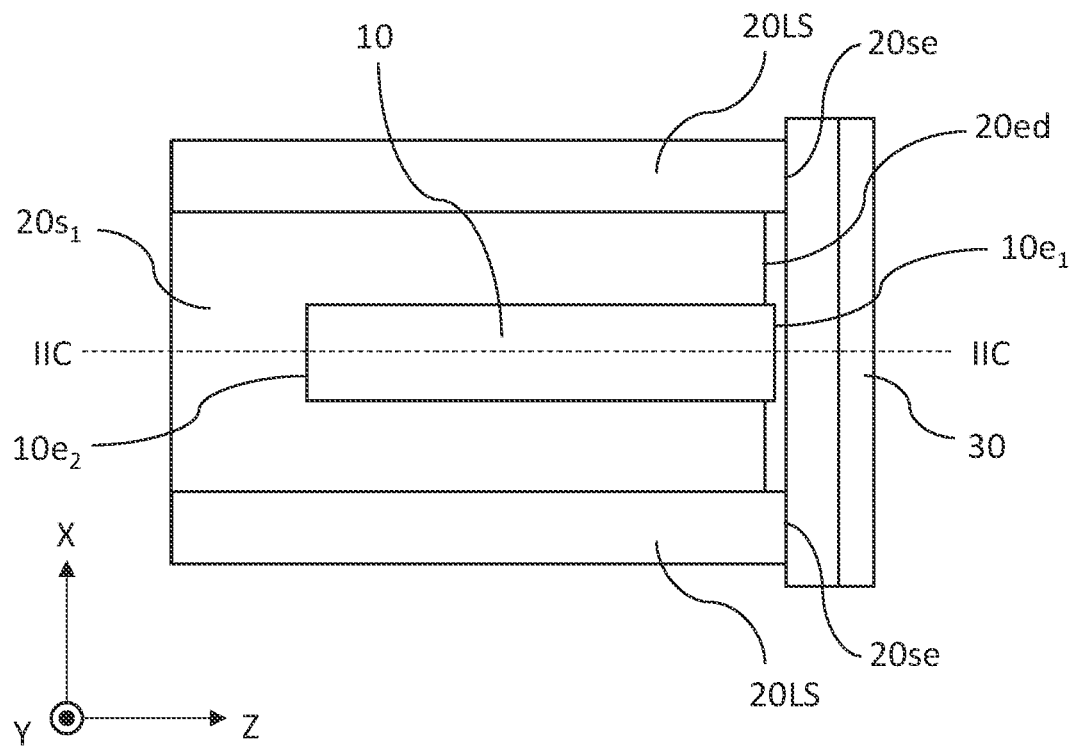
FIG. 2B is a top plan view schematically showing the laser light source 100 in FIG. 2A.
Figure 2C:
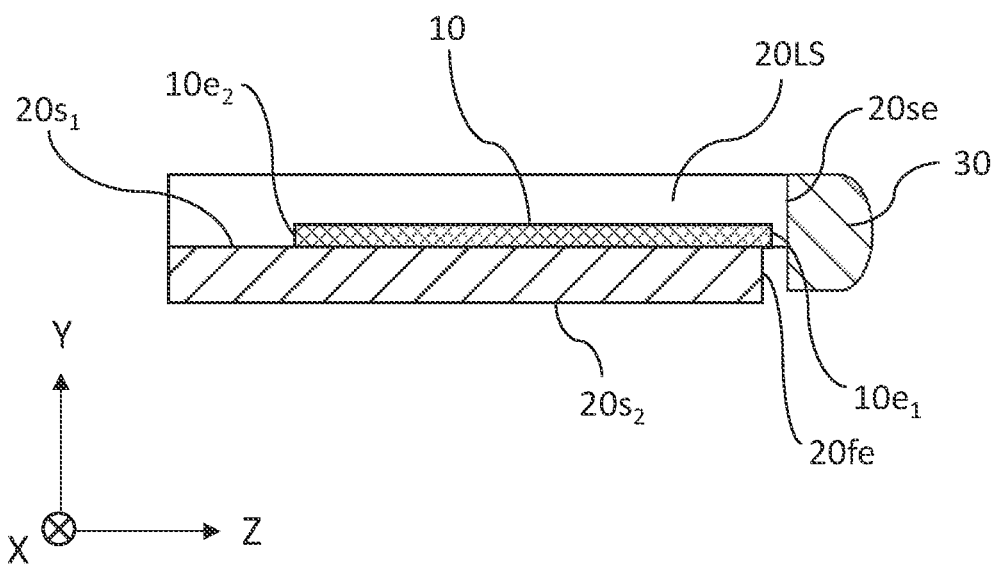
FIG. 2C is a cross-sectional view of the configuration of FIG. 2B taken along line IIC-IIC, which is parallel to the YZ plane.

FIG. 2A is a perspective view showing in more detail the configuration of the laser light source 100 in FIG. 1A, in which the semiconductor laser package 40 and the pair of lead terminals 50 are omitted. The region surrounded by a broken line in FIG. 2A shows an example of a detailed structure of the laser diode chip 10 being disposed in the submount 20. Although the submount 20 and the collimating lens 30 are shown isolated in FIG. 2A, they are actually bonded to each other. FIG. 2B is a top plan view schematically showing the laser light source 100 in FIG. 2A. FIG. 2C is a cross-sectional view of the configuration of FIG. 2B taken along line IIC-IIC, which is parallel to the YZ plane. In the present disclosure, a side at which the collimating lens 30 is located with respect to the submount 20 may be referred to as the "front."

As shown in FIG. 2A, the laser diode chip 10 is an edge-emitting type laser diode chip including: a semiconductor multilayer structure 10a that includes a first cladding layer $10C_1$, a second cladding layer $10C_2$, and an emission layer 10L; a substrate 10b supporting the semiconductor multilayer structure 10a; an emission end surface $10e_1$ through which the high-power laser light that has been generated in the emission layer 10L is emitted; and a rear end surface $10e_2$ opposite to the emission end surface $10e_1$. The emission layer 10L is located between the first cladding layer $10C_1$ and the second cladding layer $10C_2$. The laser diode chip 10 may include other layers, such as a buffer layer and a contact layer. In the present disclosure, the "emission end surface $10e_1$" may be referred to as the "first end surface $10e_1$," while the "rear end surface $10e_2$" may be referred to as the "second end surface $10e_2$."

The laser diode chip 10 is fixed to the submount 20 in a face-down state, i.e., so that the emission layer 10L is closer to the submount 20 than is the substrate 10b. The total size of the semiconductor multilayer structure 10a and the substrate 10b of the laser diode chip 10 along the Y direction is about 80 µm. The total size of the substrate 10b and the first cladding layer $10C_1$ along the Y direction is greater than the size of the second cladding layer $10C_2$ along the Y direction. In a face-down state, the distance between the emission layer 10L and the submount 20 is about 1/10 of that in a face-up state (in which the emission layer 10L would be farther from the submount 20 than is the substrate 10b). Therefore, in a face-down state, even if high-power laser light is emitted from the emission layer 10L, heat generated in the emission layer 10L can be efficiently transmitted to the submount 20. The output power of laser light according to the present embodiment is e.g. 3 W or greater and 50 W or less.

The semiconductor multilayer structure 10a may have a double-hetero structure to generate an energy level of a quantum well, for example. The emission layer 10L has a band gap that is smaller than the band gaps of the first cladding layer $10C_1$ and the second cladding layer $10C_2$. In the present embodiment, the substrate 10b and the first cladding layer $10C_1$ on the substrate 10b may each be composed of an n type semiconductor. The emission layer 10L may be composed of an intrinsic semiconductor, an n type semiconductor, or a p type semiconductor, and the second cladding layer $10C_2$ on the emission layer 10L may be composed of a p type semiconductor. The n type and the p type may be reversed. When an electric current is injected from the p type cladding layer to the n type cladding layer, a population inversion of carriers occurs in the emission layer 10L, resulting in a stimulated emission of light from the emission layer 10L. The refractive index of the emission layer 10L is designed to be higher than those of the first cladding layer $10C_1$ and the second cladding layer $10C_2$, so that light generated in the emission layer 10L is confined within the emission layer 10L via total reflection. The emission layer 10L functions as a cavity, so that laser light is emitted from the emission end surface $10e_1$ of the emission layer 10L. The cavity length of the emission layer 10L is defined by the distance from the emission end surface $10e_1$ to the rear end surface $10e_2$. The direction of the cavity length is parallel to the Z direction. The cavity length is e.g. not less than 500 µm and not more than 5000 µm. A longer cavity length allows for a broader contact area between the laser diode chip 10 and the submount 20, so that the heat generated in the emission layer 10L can be efficiently transmitted to the submount 20.

When the laser light emitted from the emission end surface $10e_1$ of the laser diode chip 10 propagates, it quickly diverges in the YZ plane and slow in the XZ plane. When not being collimated, the laser light spot has an elliptical shape in the far field, such that the elliptical shape has a major axis along the Y direction and a minor axis along the X direction, in the XY plane.

The laser diode chip 10 is able to emit laser light of violet, blue, green, or red in the visible region, or infrared or ultraviolet laser light. The emission peak wavelength of violet is preferably 350 nm or greater and 419 nm or less, and more preferably 400 nm or greater and 415 nm or less. The emission peak wavelength of blue light is preferably 420 nm or greater and 494 nm or less, and more preferably 440 nm or greater and 475 nm or less. Examples of a semiconductor laser device to emit violet or blue laser light include a semiconductor laser device containing a nitride semiconductor. Examples of nitride semiconductors include GaN, InGaN, and AlGaN. The emission peak wavelength of green light is preferably 495 nm or greater and 570 nm or less, and more preferably 510 nm or greater and 550 nm or less. Examples of a semiconductor laser device to emit green laser light include a semiconductor laser device containing a nitride semiconductor. Examples of nitride semiconductors include GaN, InGaN, and AlGaN. The emission peak wavelength of red light is preferably 605 nm or greater and 750 nm or less, and more preferably 610 nm or greater and 700 nm or less. Examples of a semiconductor laser device to emit red laser light include a semiconductor laser device containing an InAlGaP-based, GaInP-based, GaAs-based, or AlGaAs-based semiconductor. As a semiconductor laser device for red light, a semiconductor laser device having two or more waveguide regions may be used. Semiconductor laser devices containing such semiconductors are more prone to a decrease in the output power associated with heat than semiconductor laser devices containing nitride semiconductors. Increase of waveguide regions allows for dispersing heat, so that decrease in the output power of the semiconductor laser device can be reduced.

The submount 20 includes: a principal surface $20s_1$ on which the laser diode chip 10 is fixed; a pair of lens supports 20LS located at opposite sides with respect to the emission end surface $10e_1$ of the laser diode chip 10; a back surface $20s2$ located opposite to the principal surface $20s_1$; and a front end surface 20fe connecting the principal surface $20s_1$ and the back surface $20s_2$. The principal surface $20s_1$ and the front end surface 20fe define an edge 20ed of the principal surface $20s_1$. In the example shown in FIG. 2A, the pair of lens supports 20LS are a pair of protrusions being located at opposite sides with respect to the laser diode chip 10 and extending along the Z direction. In any portion behind the front end surface 20fe, the submount 20 has a U-shape continuously along the Z direction; this U-shape is created by dividing, along a plane parallel to the XZ plane, a prismatic body that is mirror-symmetric with respect to a plane parallel to the YZ plane and that extends along the Z direction. End surfaces 20se of the pair of lens supports 20LS is located outward in a direction along the cavity length with respect to the emission end surface $10e_1$ of the laser diode chip 10. The normal direction of the principal surface $20s_1$ is parallel to the Y direction.

The distance between the end surface 20se of each of the pair of lens supports 20LS and the emission end surface $10e_1$ of the laser diode chip 10 along the Z direction may be designed to be substantially equal to the focal length of the collimating lens 30. The distance between the end surface 20se of each of the pair of lens supports 20LS and the emission end surface $10e_1$ of the laser diode chip 10 along the Z direction is e.g. 50 µm or greater and 100 µm or less. The size of each of the pair of lens supports 20LS along the Y direction may be approximately the same as the size of the collimating lens 30 along the Y direction; the size of each of the pair of lens supports 20LS along the Y direction may be greater than, equal to, or smaller than the size of the collimating lens 30 along the Y direction. The size of each of the pair of lens supports 20LS along the Y direction is e.g. 100 µm or greater and 500 µm or less.

The size of the submount 20 along the X direction is e.g. 1 mm or greater and 3 mm or less, and the size of a portion of the submount 20 other than the pair of lens supports 20LS along the Y direction is e.g. 100 µm or greater and 500 µm or less, and the size of a portion of the submount 20 other than the pair of lens supports 20LS along the Z direction is e.g. 1 mm or greater and 6 mm or less. In the present disclosure, the upper limits of these sizes may be determined in view of reduction in size of the laser light source 100.

In the submount 20, the emission end surface $10e_1$ of the laser diode chip 10 is located outward with respect to the edge 20ed of the principal surface $20s_1$ in a direction along the cavity length. The distance between the emission end surface $10e_1$ of the laser diode chip 10 and the edge 20*ed* of the principal surface $20s_1$ along the Z direction is e.g. 2 μm or greater and 50 μm or less. With this arrangement, even if the laser diode chip 10 and the principal surface $20s_1$ of the submount 20 are fixed by a bonding material of an inorganic material such as gold tin (AuSn) in a face-down state, for example, climb-up of the bonding material onto the emission end surface $10e_1$ of the emission layer 10L can be reduced. In the laser light source disclosed in Patent Document 1, when the laser diode chip is disposed in a face-down state, the bonding material that bonds the laser diode chip and the submount together may possibly climb onto the emission end surface of the emission layer of the laser diode chip, which may result in a decrease in the output power of the laser light that is emitted from the laser diode chip. In the laser light source 100 of the present embodiment, such a decrease in the output power of laser light can be reduced.

A portion or a whole of the submount 20 may be made of a ceramic containing at least one selected from the group consisting of AlN, SiC, and aluminum oxide or an alloy such as CuW, for example. The submount 20 can be provided by sintering a powder of ceramic, for example. The thermal conductivity of the ceramic may be e.g. 10 [W/m·K] or greater and 500 [W/m·K] or less. In order to reduce deformation due to the heat that is applied when fixing the laser diode chip 10, the ceramic may have a low coefficient of thermal expansion. The coefficient of thermal expansion may be $2 \times 10^{-6}$ [1/K] or greater and $1 \times 10^{-5}$ [1/K] or less. On the principal surface $20s_1$ and the back surface $20s_2$ of the submount 20, a metal film (such as gold plating) having a thickness of e.g. 0.5 μm or greater and 10 μm or less may be formed. With the metal film disposed on the principal surface $20s_1$, the laser diode chip 10 can be bonded to the principal surface $20s_1$ via, for example, gold tin. With the metal film disposed on the back surface $20s_2$, the submount 20 can be bonded to a bottom $40b_1$ via, for example, gold tin.

The collimating lens 30 is a so-called FAC (Fast Axis Collimator) lens which collimates, within the laser light emitted from the laser diode chip 10, components of the laser light that diverge significantly in the YZ plane. Optionally, a so-called SAC (Slow Axis Collimator) lens (not shown) that collimates, within the laser light, components that diverge to a lesser extent in the XZ plane may be disposed outside the laser light source 100. In the present disclosure, to "collimate" means not only converting laser light into parallel light, but also reducing the divergence angle of the laser light. Depending on the application, other lenses such as a converging lens may be used instead of the collimating lens 30.

The collimating lens 30 is a cylindrical lens having a structure that is elongated along the X direction, and has no or little curvature along the X direction and a curvature along the Y direction. The direction in which the collimating lens 30 extends is a direction that is perpendicular to both the normal direction of the principal surface $20s_1$ of the submount 20 and the cavity length direction. With the approximately same size of the collimating lens 30 and the pair of lens supports 20LS along the Y direction, it is easy to dispose the collimating lens 30 such that the centroid of the collimating lens 30 is located between the pair of lens supports 20LS when viewed in the cavity length direction. Based on this relative positioning of the centroid of the collimating lens 30, the collimating lens 30 can be stably disposed on the submount 20 with a good accuracy.

In the present embodiment, with respect to the back surface $20s_2$ of the submount 20, the upper surface of each of the pair of lens supports 20LS is located at a height along the Y direction substantially equal to the height along the Y direction at which the upper surface of the collimating lens 30 is located. The position of the collimating lens 30 relative to the pair of lens supports 20LS is coarsely adjusted so that the above two heights are substantially equal. Thereafter, while laser light is allowed to be emitted from the laser diode chip 10, the position of the collimating lens 30 relative to the pair of lens supports 20LS is finely adjusted so that the laser light is appropriately collimated. The aforementioned two heights are not necessarily substantially equal, but may be different from each other.

In the present embodiment, the collimating lens 30 is uniform along the X direction, and therefore the alignment between the emission end surface $10e_1$ of the laser diode chip 10 and the collimating lens 30 along the X direction does not need to be taken into consideration. It is sufficient that, in the collimating lens 30, at least a facing portion, i.e., a portion facing the emission end surface $10e_1$ of the laser diode chip 10, and a peripheral portion near the facing portion are uniform along the X direction. Therefore, the remainders, i.e., side portions, do not need to be uniform along the X direction, and do not need to be transparent. The size of each of side portions of the collimating lens 30 along the Y direction may be greater than, equal to, or smaller than the sizes of the facing portion and the peripheral portion along the Y direction. The collimating lens 30 may be made of at least one of glass, quartz, synthetic quartz, sapphire, transparent ceramics, and plastics, for example.

The collimating lens 30 is bonded to the end surfaces 20*se* of the pair of lens supports 20LS in a direction along the Z direction. Even if there is a slight variation in the thickness of a bonding material that bonds together the collimating lens 30 and the end surfaces 20*se* of the pair of lens supports 20LS, such variation hardly affects the position of the collimating lens 30 along the Y direction. There may be a configuration in which a pedestal having a surface parallel to the principal surface $20s_1$ is disposed in front of the submount 20 and the collimating lens 30 is disposed on the surface of the pedestal, which is different from a configuration in the present embodiment. However, in such a configuration, if variation occurs in the thickness of the bonding material between the collimating lens 30 and the surface of the pedestal, a misalignment along the Y direction may occur between the laser diode chip 10 and the collimating lens 30, so that the optical axis of the laser light that is emitted from the laser light source 100 to the outside may possibly be greatly misoriented. On the other hand, in the present embodiment, misalignments between the laser diode chip 10 and the collimating lens 30 along the Y direction are less likely to occur, and the optical axis of the laser light that is emitted from the laser light source 100 to the outside can be oriented in a direction as designed. In the present embodiment, even if a slight variation occurs in the thickness of the bonding material, such variation results in merely a slight deviation in the position of the collimating lens 30 along the optical axis of the laser light, which hardly affects the orientation of the optical axis of the laser light.

The collimating lens 30 and the end surfaces 20*se* of the pair of lens supports 20LS may be bonded by a bonding material of an inorganic material such as gold tin. Metal films may be previously formed on the bonding surface of the collimating lens 30 and the end surfaces 20*se* of the pair of lens supports 20LS. Such metal films allow, for example, bonding with gold tin. The bonding temperature for gold tin is about 280° C. Given that the ceramic composing the submount 20 has a low thermal conductivity, the influences of heat, applied during bonding of the collimating lens 30 and the end surfaces 20*se* of the pair of lens supports 20LS, on the laser diode chip 10 can be reduced.

In another example, the collimating lens 30 and the end surfaces 20*se* of the pair of lens supports 20LS may be bonded together with a bonding material containing a thermosetting resin. The bonding temperature for thermosetting resins is about 100° C., which is lower than the bonding temperature for inorganic materials. Therefore, the influences of heat, applied during bonding of the end surfaces 20*se* of the collimating lens 30 and the pair of lens supports 20LS, on the laser diode chip 10 can be further reduced. During bonding between the collimating lens 30 and the end surfaces 20*se* of the pair of lens supports 20LS, the thermosetting resin may be heated by irradiating the position indicated by a point P shown in FIG. 2A with laser light, for example. The distance between the position of point P and each of the end surfaces 20*se* of the pair of lens supports 20LS along the Z direction is e.g. 50 μm or greater and 500 μm or less. In the present embodiment, in a top plan view, the optical axis of the laser light emitted from the laser diode chip 10 and the bonding material do not overlap each other; therefore, even if an out-gas is generated from the bonding material containing a thermosetting resin, the out-gas can be hindered from approaching toward the laser diode chip 10. This can reduce occurrence of dust attraction (described later) at the emission end surface $10e_1$ of the laser diode chip 10.

Some inorganic material-based bonding materials may contain organic matter as a binder. Using such bonding materials to effect the bonding between the collimating lens 30 and the end surfaces 20*se* of the pair of lens supports 20LS can also restrain the out-gas, generated by heating, from approaching the laser diode chip 10.

Without even using a bonding material, the collimating lens 30 and the end surfaces 20*se* of the pair of lens supports 20LS may be bonded via direct bonding. Examples of direct bonding include diffusion bonding, room temperature bonding, and anodic bonding.

As will be clear from the description of the embodiment using a bonding material, bonding via direct bonding can reduce misalignments of the collimating lens 30 along the Y direction as in bonding via a bonding material does.

In the laser light source 100 of the present embodiment, the submount 20 supports the laser diode chip 10 and the collimating lens 30. With the reduced distance between the emission end surface $10e_1$ of the laser diode chip 10 and the collimating lens 30, divergence of laser light emitted from the laser diode chip 10 can be reduced by the small collimating lens 30 instead of occurrence of great divergence. This allows for obtaining the laser light source 100 of a small size. Also, the diameter of a collimated beam passing through the collimating lens 30 can be reduced.

The semiconductor laser package 40 may hermetically seal the laser diode chip 10, the submount 20, and the collimating lens 30. When the laser diode chip 10 emits laser light of a short wavelength, e.g., 350 nm or greater and 570 nm or less, organic gas components and the like that are contained in the ambient may be decomposed by the laser light, so that the decomposed matter may adhere to the emission end surface $10e_1$ of the laser diode chip 10. Moreover, if the emission end surface $10e_1$ of the laser diode chip 10 is in contact with the outside air, deterioration of the end surface may progress during operation due to dust attraction or the like. Such deterioration of the end surface may lead to decrease in the optical output power of the laser diode chip 10. In order to enhance the reliability of the laser diode chip 10 for extending the operation life, it is preferable that the semiconductor laser package 40 seals the laser diode chip 10 hermetically. Hermetic sealing by the semiconductor laser package 40 may be conducted regardless of the wavelength of the laser light to be emitted from the laser diode chip 10.

The base 40*b* of the semiconductor laser package 40 is in thermal contact with the back surface $20s_2$ of the submount 20. The base 40*b* may be made of a material of high thermal conductivity. The material is a metal, including, for example, at least one selected from the group consisting of Cu, Al, Ag, Fe, Ni, Mo, Cu, W, and CuMo. In order to align the emission end surface $10e_1$ of the laser diode chip 10 and the light-transmitting window 40*w* in height, a member 40*m* of high thermal conductivity may be disposed between a bottom surface 40*bt* of the base 40*b* and the submount 20, as shown in FIG. 1B. The member 40*m* may be made of the same material as that of the portion of the base 40*b* including the bottom surface 40*bt*. Alternatively, at least a portion of the bottom surface 40*bt* of the base 40*b* may project upward, and the submount 20 may be disposed on this projecting portion of the bottom surface 40*bt*. The portion of the base 40*b* including the bottom surface 40*bt* may be made of copper, for example. The portion of the base 40*b* that surrounds the laser diode 10, the submount 20, and the collimating lens 30 may be made of kovar, for example. Kovar is an alloy in which nickel and cobalt are added to iron, which is a main component. The lid 40L of the semiconductor laser package 40 may be made of the same material as, or a different material from, that of the base 40*b*. The light-transmitting window 40*w* of the semiconductor laser package 40, which is mounted on the base 40*b*, transmits the laser light emitted from the laser diode chip 10. Similarly to the collimating lens 30, the light-transmitting window 40*w* of the semiconductor laser package 40 can be made of at least one of glass, quartz, synthetic quartz, sapphire, transparent ceramics, and plastics, for example.

Each of the pair of lead terminals 50 is electrically connected to the laser diode chip 10 via a wire as described below. In the example shown in FIG. 2A, a metal film (e.g., gold plating) is disposed on the upper surface of the laser diode chip 10. This metal film is electrically connected to one of the pair of lead terminals 50 via a wire. Similarly, a metal film (e.g., gold plating) is also disposed on the principal surface $20s_1$ of the submount 20. This metal film is electrically connected to the other one of the pair of lead terminals 50 via a wire. Via the pair of lead terminals 50, an electric current is injected from the second cladding layer $10C_2$ to the first cladding layer $10C_1$ of the laser diode chip 10. The pair of lead terminals 50 are electrically connected to an external circuit (not shown) that adjusts the emission timing and the output power of laser light to be emitted from the laser diode chip 10. The pair of lead terminals 50 are made of a material having good electrical conduction. Examples of such materials include Fe—Ni alloys, Cu alloys, and other metals.

In the laser light source 100 of the present embodiment, the submount 20 supports the laser diode chip 10 on the principal surface $20s_1$ between the pair of lens supports 20LS, and supports the collimating lens 30 with the end surfaces 20*se* of the pair of lens supports 20LS. This allows for facilitating alignment between the laser diode chip 10 and the collimating lens 30 as described above, and the laser light source 100 of a small size can be obtained. Furthermore, in the laser light source 100 of the present embodiment, even when the laser diode chip 10 is disposed on the submount 20 in a face-down state, climbing-up of the bonding material onto the emission end surface $10e_1$ of the laser diode chip 10 can be reduced.

Modified Examples of Embodiment 1

Next, Modified Examples 1 to 5 of the laser light source 100 according to Embodiment 1 of the present disclosure will be described. In the Modified Examples described below, the semiconductor laser package 40 and the pair of lead terminals 50 will be omitted from illustration. Descriptions repetitive of the description above may be omitted.

Figure 3A:
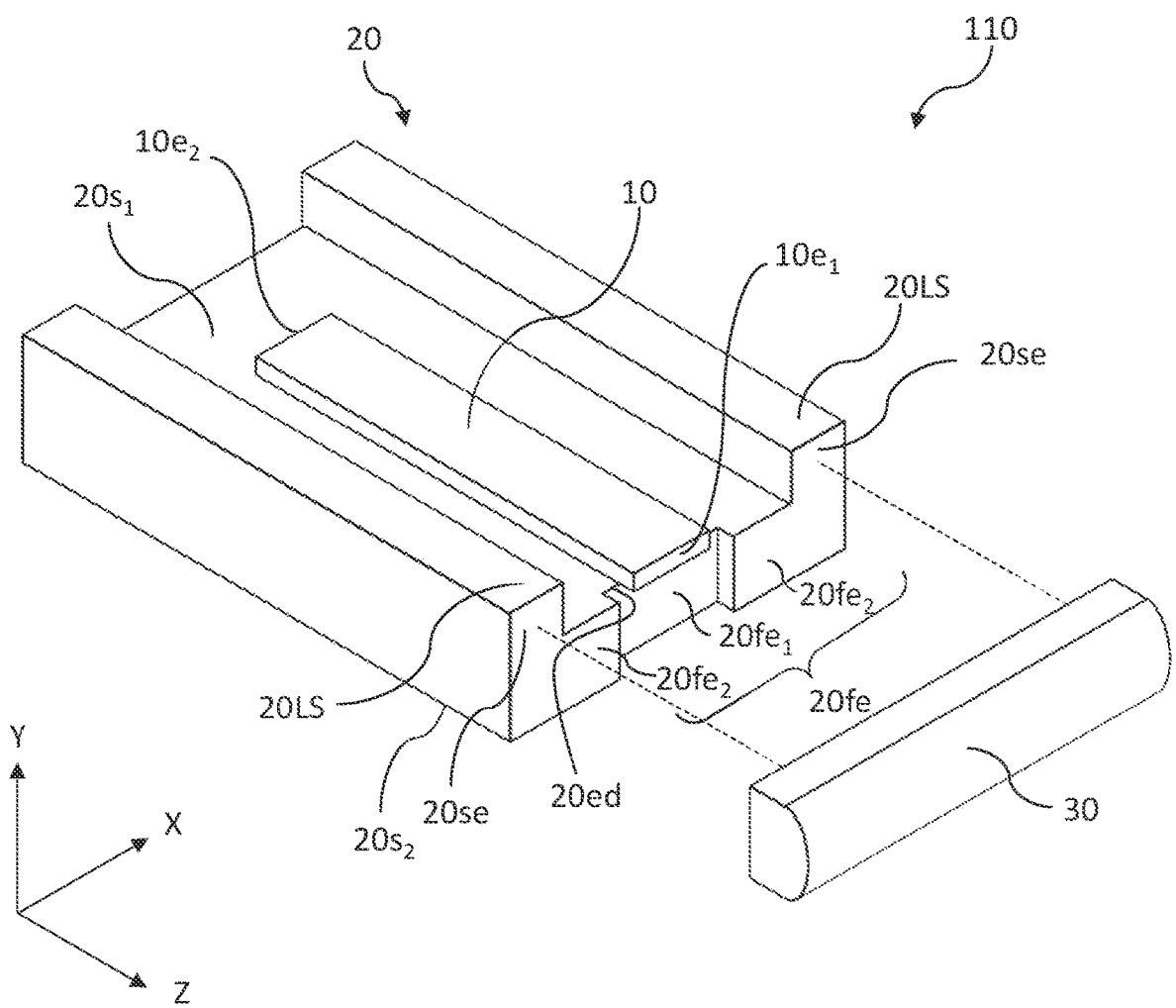
FIG. 3A is a perspective view schematically showing an example of a configuration of a laser light source 110 according to Modified Example 1 of Embodiment 1 of the present disclosure.
Figure 3B:
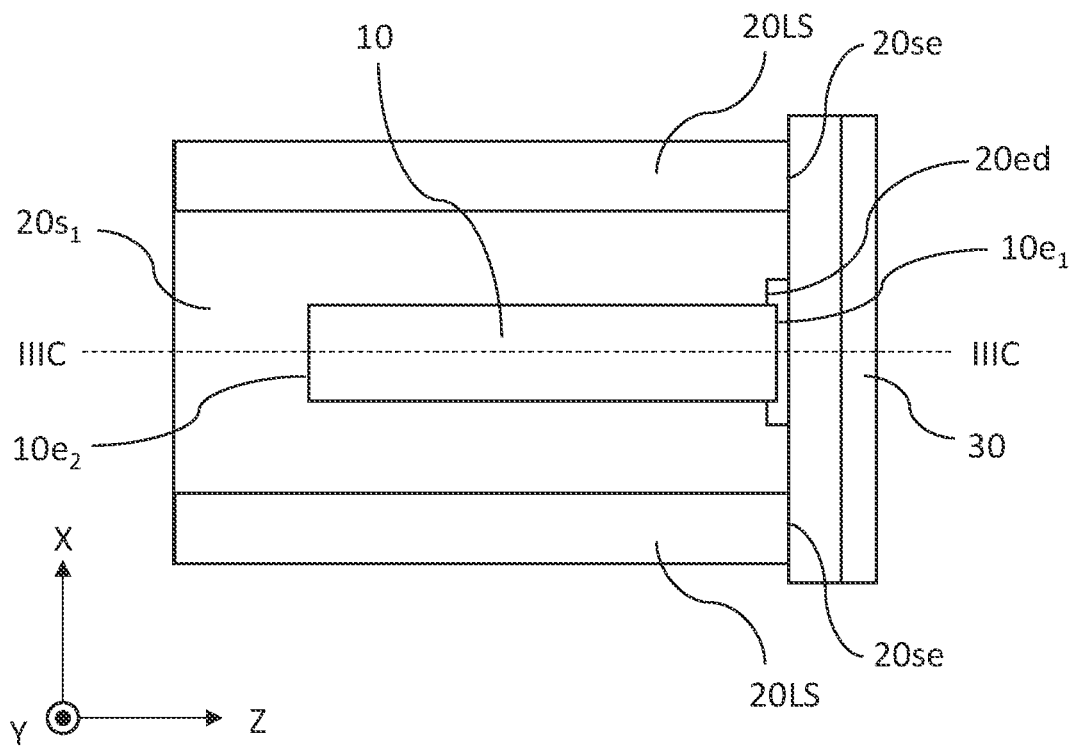
FIG. 3B is a top plan view schematically showing the laser light source 110 in FIG. 3A.
Figure 3C:
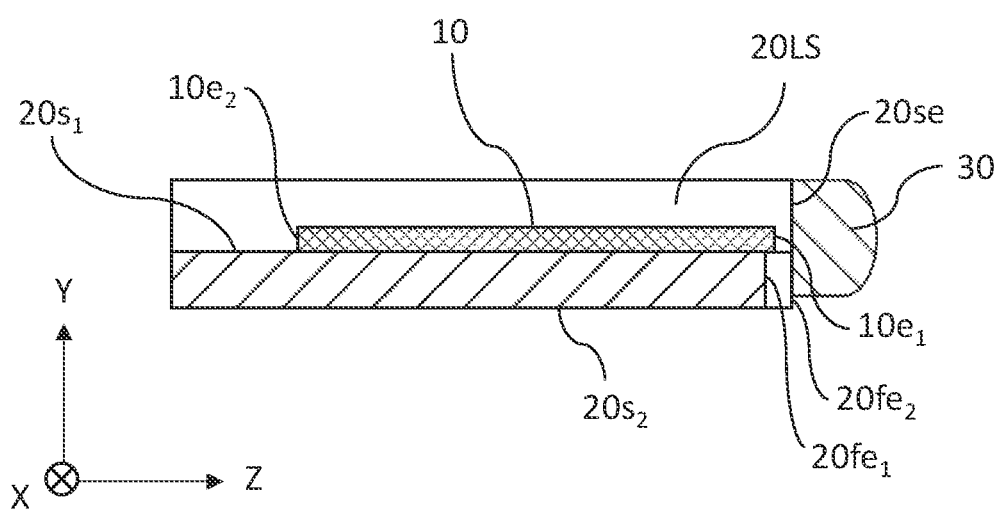
FIG. 3C is a cross-sectional view of the configuration of FIG. 3B taken along line IIIC-IIIC, which is parallel to the YZ plane.

With reference to FIG. 3A to FIG. 3C, an example of a configuration of a laser light source 110 according to Modified Example 1 of Embodiment 1 of the present disclosure will be described. FIG. 3A is a perspective view schematically showing an example of a configuration of the laser light source 110 according to Modified Example 1 of Embodiment 1 of the present disclosure. FIG. 3B is a top plan view schematically showing the laser light source 110 in FIG. 3A. FIG. 3C is a cross-sectional view of the configuration of FIG. 3B taken along line IIIC-IIIC, which is parallel to the YZ plane. The laser light source 110 according to Modified Example 1 of Embodiment 1 differs from the laser light source 100 according to Embodiment 1 in the shape of the submount 20. The front end surface 20fe of the submount 20 includes a central end surface $20fe_1$, and side end surfaces $20fe_2$ located on opposite sides of the central end surface $20fe_1$. The central end surface $20fe_1$ is recessed with respect to the side end surfaces $20fe_2$ in a direction along the cavity length.

The edge 20ed of the principal surface $20s_1$ according to Modified Example 1 of Embodiment 1 is defined by the principal surface $20s_1$ and the central end surface $20fe_1$. The recess in the central end surface $20fe_1$ has a size along the Z direction of e.g. 5 μm or greater and 100 μm or less, a size along the X direction of e.g. 50 μm or greater and 200 μm or less, and the size along the Y direction below the principal surface $20s_1$ of e.g. 100 μm or greater and 500 μm or less. The recess does not need to penetrate throughout the Y direction.

The emission end surface $10e_1$ of the laser diode chip 10 is located outward in a direction along the cavity length with respect to the edge 20ed of the principal surface $20s_1$, which is defined by the principal surface $20s_1$ and the central end surface $20fe_1$. Similarly to the end surfaces 20se of the pair of lens supports 20LS, the side end surfaces $20fe_2$ of the submount 20 is located outward with respect to the emission end surface $10e_1$ of the laser diode chip 10 in a direction along the cavity length. With the edge 20ed of the principal surface $20s_1$ being defined by the principal surface $20s_1$ and the central end surface $20fe_1$, climbing-up of the bonding material onto the emission end surface $10e_1$ of the laser diode chip 10 can be reduced. The submount 20 according to Modified Example 1 of Embodiment 1 can be obtained by removing a portion in the front end surface 20fe from the aforementioned U shape continuously along the Z direction, and thus can be easily produced. Moreover, the collimating lens 30 is bonded to an L-shaped end surface containing the end surfaces 20se of the pair of lens supports 20LS and the side end surfaces $20fe_2$. This allows for increasing the contact area between the collimating lens 30 and the submount 20, which can facilitate bonding.

Figure 4A:
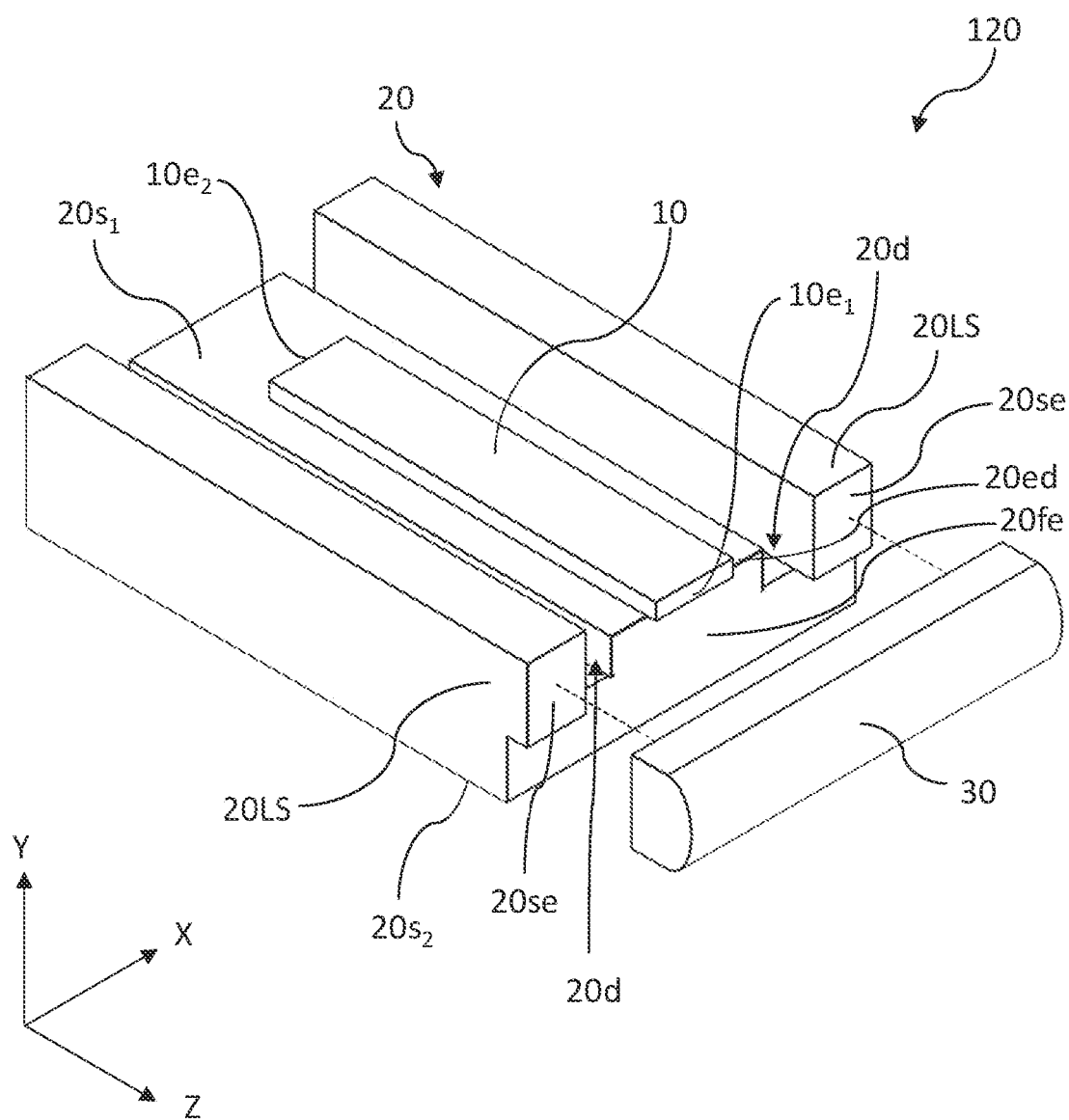
FIG. 4A is a perspective view schematically showing an example of a configuration of a laser light source 120 according to Modified Example 2 of Embodiment 1 of the present disclosure.
Figure 4B:
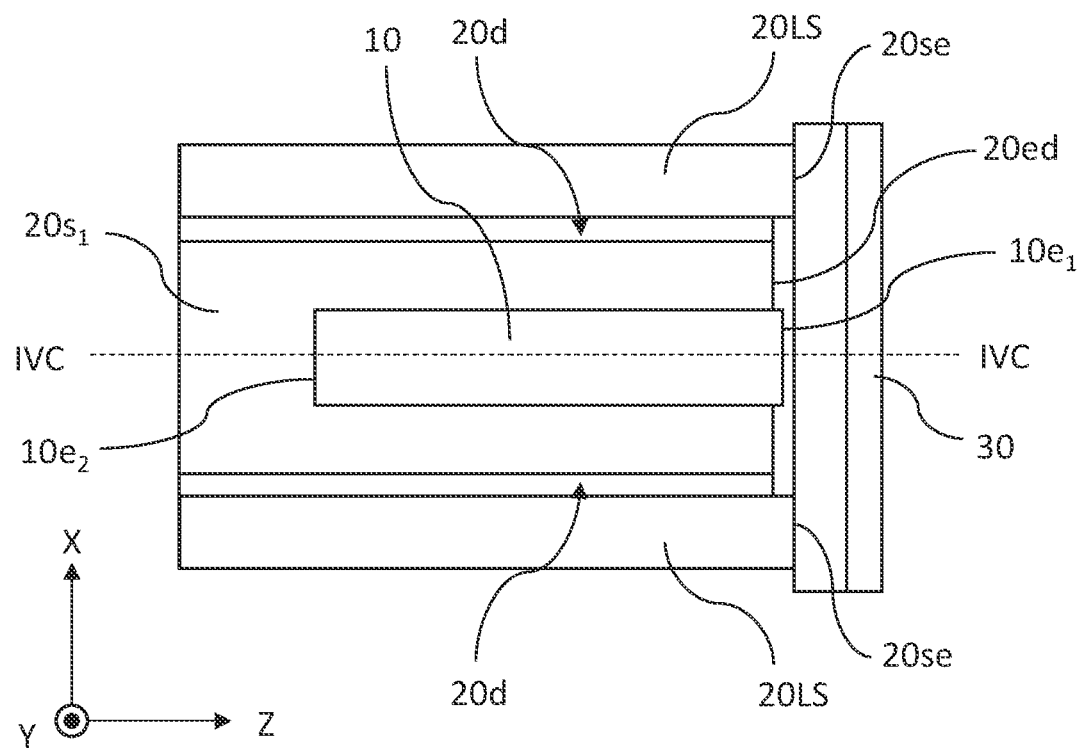
FIG. 4B is a top plan view schematically showing the laser light source 120 in FIG. 4A.
Figure 4C:
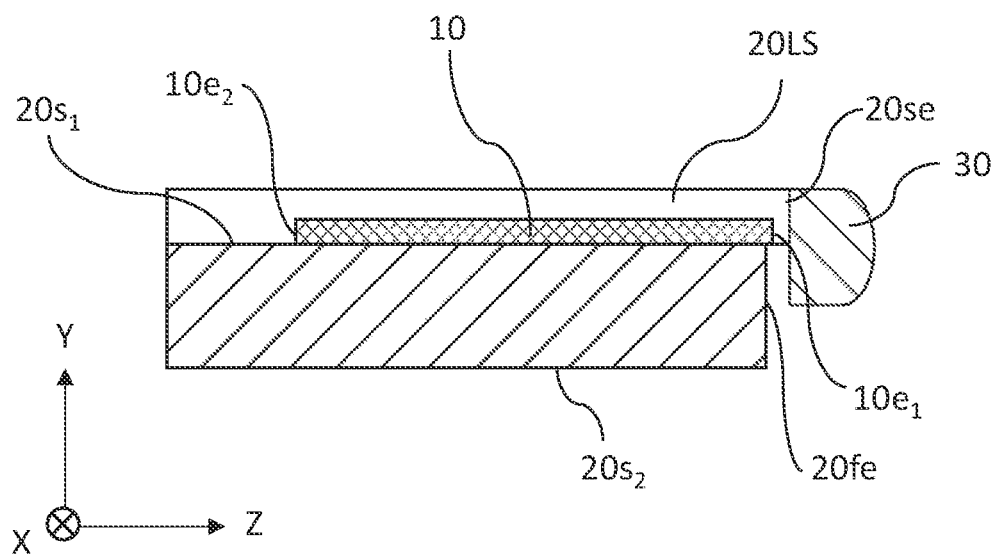
FIG. 4C is a cross-sectional view of the configuration of FIG. 4B taken along line IVC-IVC, which is parallel to the YZ plane.

Next, with reference to FIG. 4A to FIG. 4C, an example of a configuration of a laser light source 120 according to Modified Example 2 of Embodiment 1 of the present disclosure will be described. FIG. 4A is a perspective view schematically showing an example of a configuration of the laser light source 120 according to Modified Example 2 of Embodiment 1 of the present disclosure. FIG. 4B is a top plan view schematically showing the laser light source 120 in FIG. 4A. FIG. 4C is a cross-sectional view of the configuration of FIG. 4B taken along line IVC-IVC, which is parallel to the YZ plane. The laser light source 120 according to Modified Example 2 of Embodiment 1 differs from the laser light source 100 according to Embodiment 1 in the shape of the submount 20. The submount 20 according to Modified Example 2 of Embodiment 1 has a groove 20d between each of the pair of lens supports 20LS and the laser diode chip 10, the grooves 20d extending in a direction along the cavity length. Although the example shown in FIG. 4B illustrates that the grooves 20d adjoin the pair of lens supports 20LS, the grooves 20d do not need to adjoin the pair of lens supports 20LS. Each groove 20d has a size along the X direction of e.g. 100 μm or greater and 500 μm or less, a size along the Y direction of e.g. 50 μm or greater and 300 μm or less, and a size along the Z direction below the edge 20ed of the principal surface $20s_1$ of e.g. 1 mm or greater and 6 mm or less. The grooves 20d do not need to penetrate throughout the Z direction. With the grooves 20d, influence of heat, applied during bonding of the collimating lens 30 and the end surfaces 20se of the pair of lens supports 20LS, on the laser diode chip 10 can be reduced.

Figure 5A:
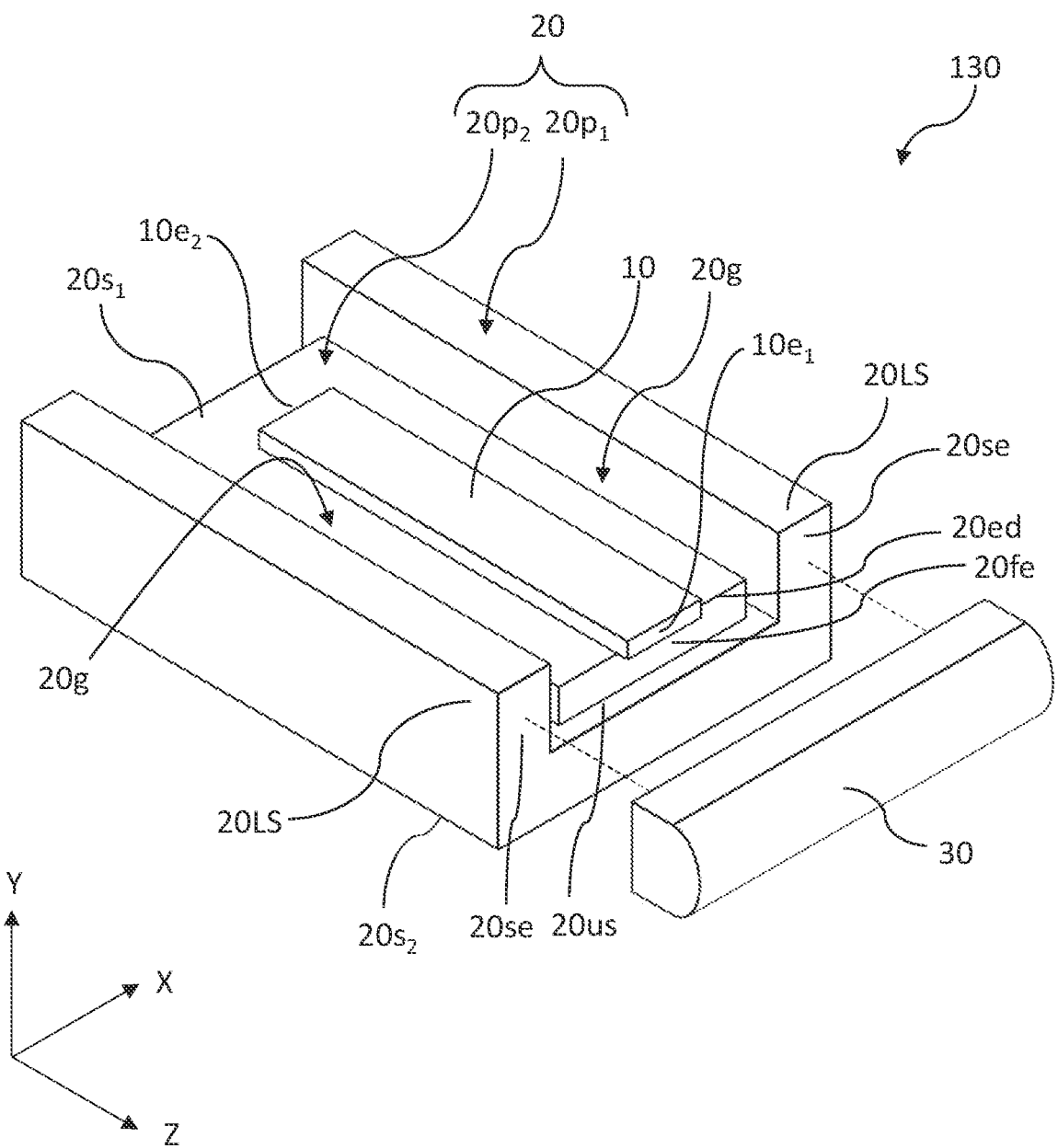
FIG. 5A is a perspective view schematically showing an example of a configuration of a laser light source 130 according to Modified Example 3 of Embodiment 1 of the present disclosure.
Figure 5B:
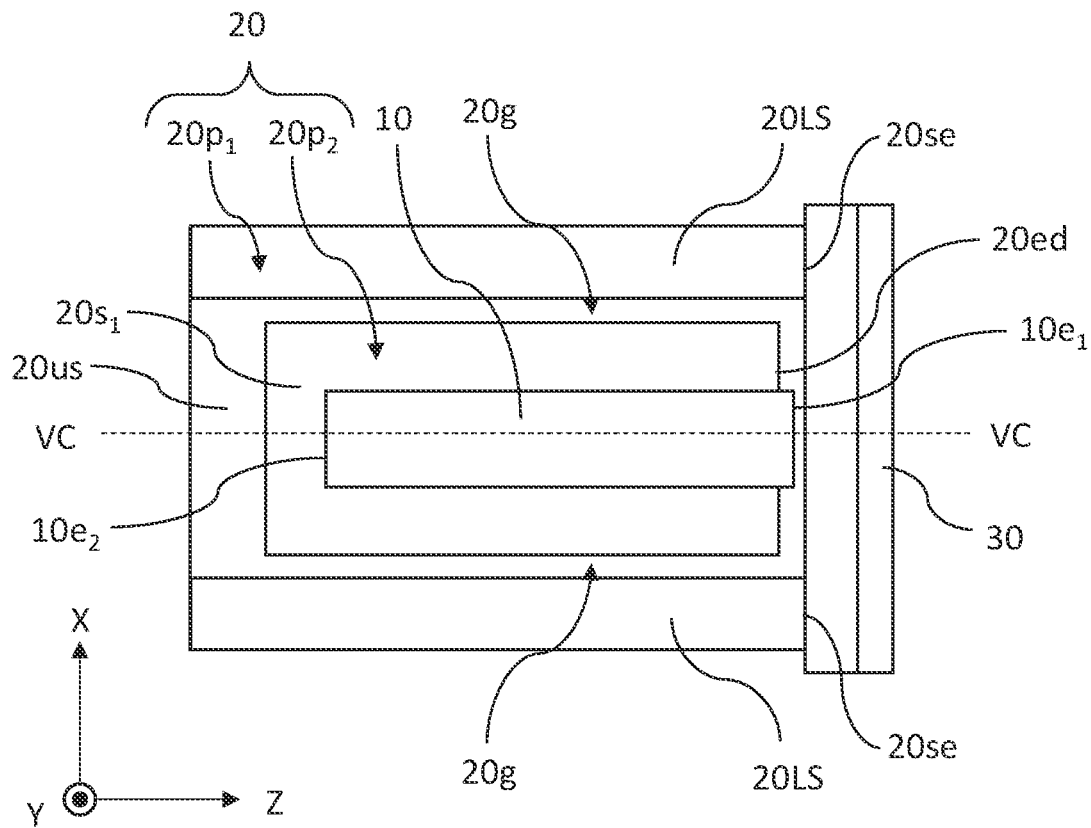
FIG. 5B is a top plan view schematically showing the laser light source 130 in FIG. 5A.
Figure 5C:
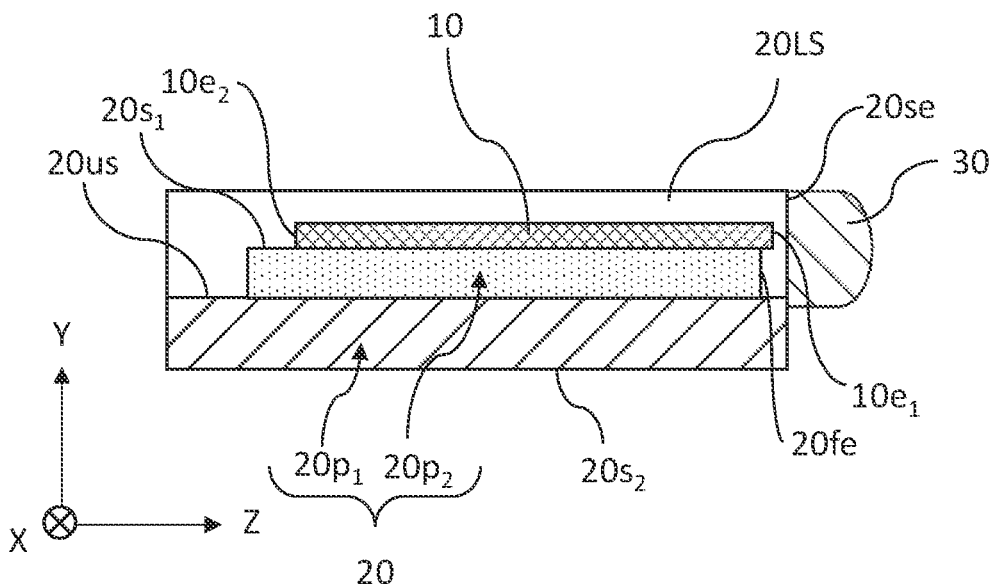
FIG. 5C is a cross-sectional view of the configuration of FIG. 5B taken along line VC-VC, which is parallel to the YZ plane.

Next, with reference to FIG. 5A to FIG. 5C, an example of a configuration of a laser light source 130 according to Modified Example 3 of Embodiment 1 of the present disclosure will be described. FIG. 5A is a perspective view schematically showing an example of a configuration of the laser light source 130 according to Modified Example 3 of Embodiment 1 of the present disclosure. FIG. 5B is a top plan view schematically showing the laser light source 130 in FIG. 5A. FIG. 5C is a cross-sectional view of the configuration of FIG. 5B taken along line VC-VC, which is parallel to the YZ plane. The laser light source 130 according to Modified Example 3 of Embodiment 1 differs from the laser light source 100 according to Embodiment 1 in the configuration of the submount 20. The submount 20 according to Modified Example 3 of Embodiment 1 includes a first submount portion $20p_1$ and a second submount portion 20p2. The first submount portion $20p_1$ includes a pair of lens supports 20LS on an upper surface 20us. The first submount portion $20p_1$ has the aforementioned U shape continuously along the Z direction. The first submount portion $20p_1$ may be made of a ceramic containing at least one selected from the group consisting of AlN, SiC, and aluminum oxide or an alloy such as CuW, for example. The second submount portion $20p_2$ is fixed on the upper surface 20us of the first submount portion $20p_1$, so as to be located between the pair of lens supports 20LS. The second submount portion $20p_2$ has a principal surface $20s_1$ on which the laser diode chip 10 is mounted, and a front end surface 20fe facing the collimating lens 30. The principal surface $20s_1$ is a surface of the first submount portion $20p_1$ that is opposite to a surface being fixed to the upper surface 20us. In the present disclosure, the front end surface 20fe and the back surface $20s_2$ do not need to be directly joined. In the present disclosure, one side of the front end surface 20fe abuts with one side of the principal surface $20s_1$, and this side along which the front end surface 20fe and the principal surface $20s_1$ abut each other defines the edge 20ed of the principal surface $20s_1$. When the thermal conductivity of the second submount portion $20p_2$ is higher than the thermal conductivity of the first submount portion $20p_1$, heat that is generated from the laser diode chip 10 can be efficiently transmitted to the outside. The second submount portion $20p_2$ may be made of at least one selected from the group consisting of Cu, Al, Ag, Fe, Ni, Mo, Cu, W, CuW, CuMo, AlN, SiC, and aluminum oxide, for example. The second submount portion $20p_2$ has a size along the X direction of e.g. 0.5 mm or greater and 1.5 mm or less, a size along the Y direction of e.g. 0.1 mm or greater and 0.5 mm or less, and a size along the Z direction of e.g. 1 mm or greater and 6 mm or less.

In the submount 20, the first submount portion $20p_1$ and the second submount portion $20p_2$ are separate pieces, so that the position of the second submount portion $20p_2$ can be adjusted on the first submount portion $20p_1$. As in this example, the submount 20 may include a part having the principal surface $20s_1$ and a part having the pair of lens supports 20LS, these parts being separate pieces. In this submount 20, an interspace 20g exists between each of the pair of lens supports 20LS and the second submount portion $20p_2$. The size of each interspace 20g along the X direction is e.g. 50 µm or greater and 300 µm or less. The sizes of each interspace 20g along the Y direction and the Z direction are determined by the sizes of the second submount portion $20p_2$ along the Y direction and the Z direction, respectively. With the interspaces 20g, influence of the heat, exerted during bonding of the collimating lens 30 and the end surfaces 20se of the pair of lens supports 20LS, on the laser diode chip 10 can be reduced as in the laser light source 120 according to Modified Example 2 of Embodiment 1.

Figure 6A:
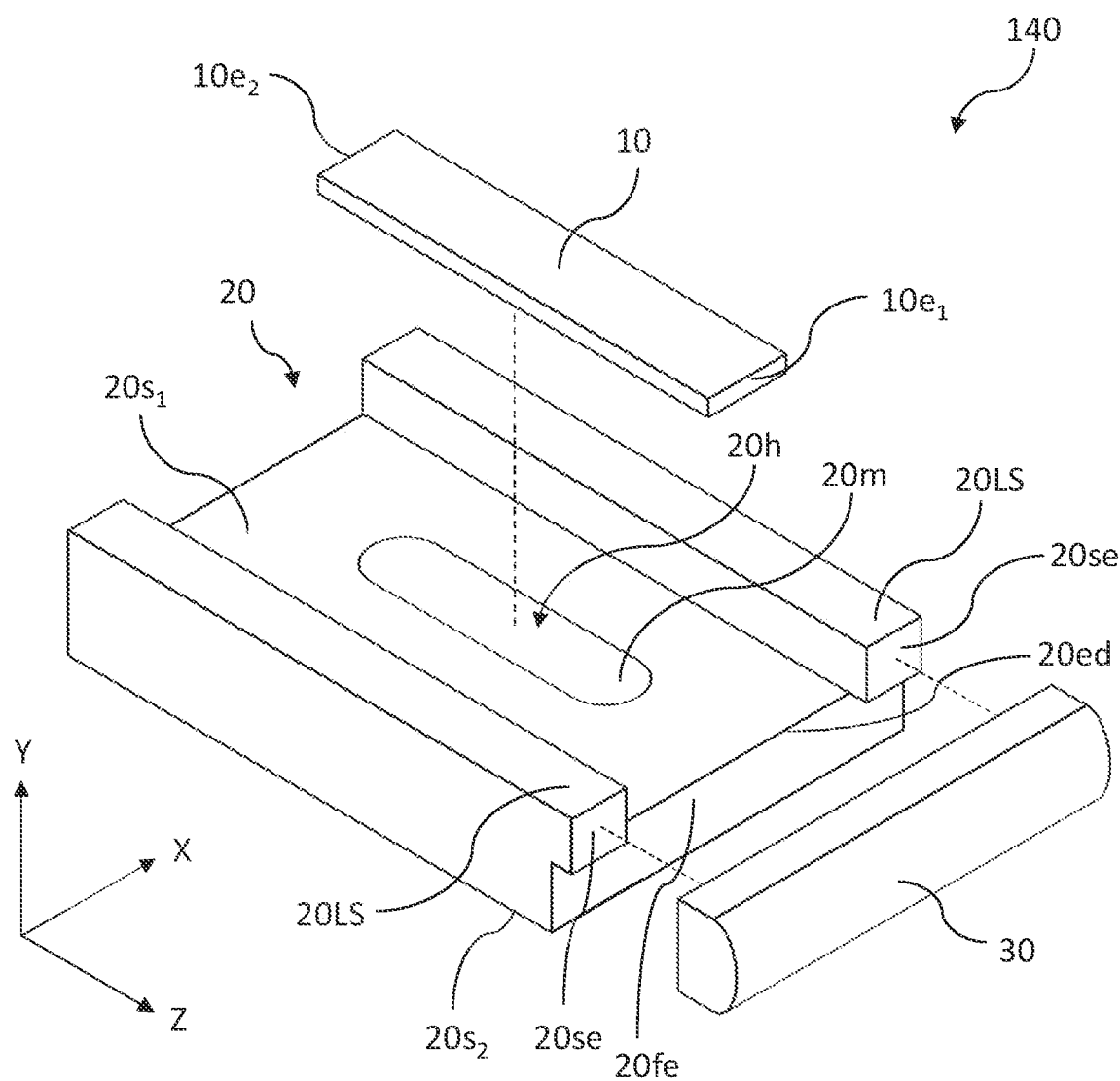
FIG. 6A is a perspective view schematically showing an example of a configuration of a laser light source 140 according to Modified Example 4 of Embodiment 1 of the present disclosure.
Figure 6B:
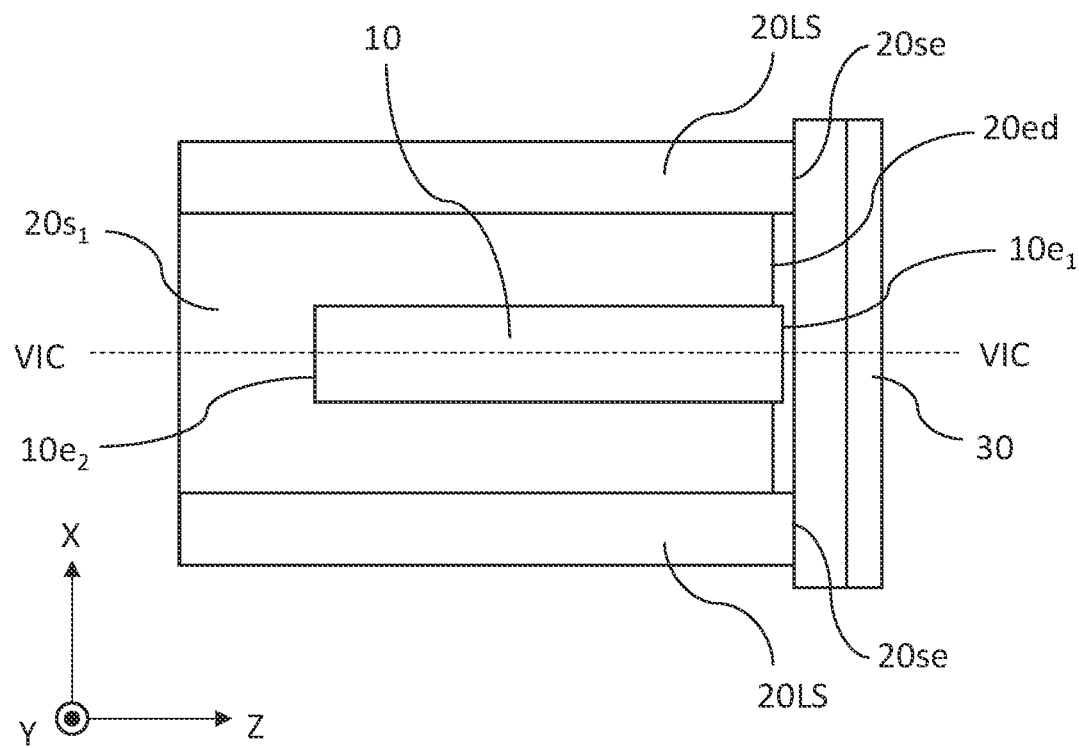
FIG. 6B is a top plan view schematically showing the laser light source 140 in FIG. 6A.
Figure 6C:
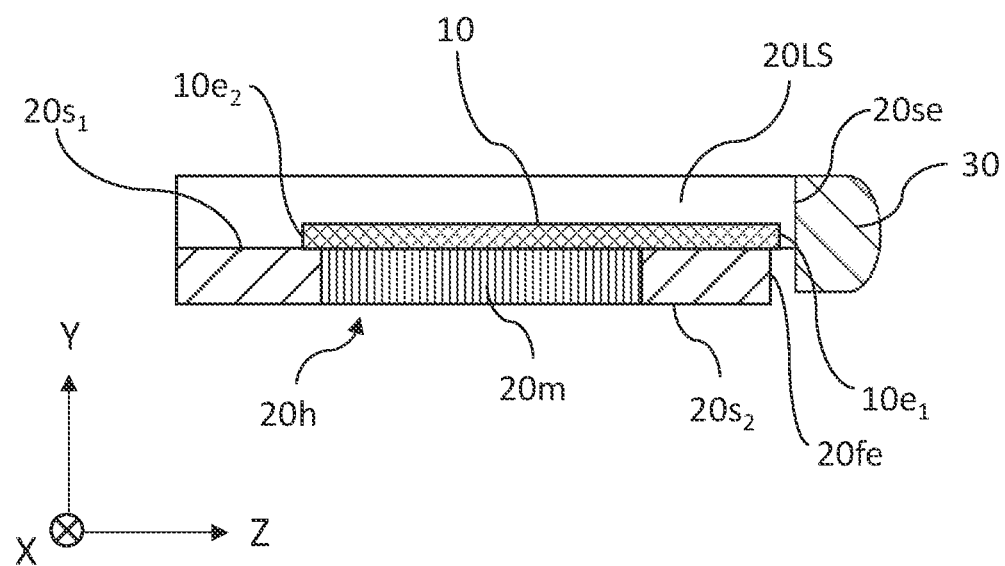
FIG. 6C is a cross-sectional view of the configuration of FIG. 6B taken along line VIC-VIC, which is parallel to the YZ plane.

Next, with reference to FIG. 6A to FIG. 6C, an example of a configuration of a laser light source 140 according to Modified Example 4 of Embodiment 1 of the present disclosure will be described. FIG. 6A is a perspective view schematically showing an example of a configuration of the laser light source 140 according to Modified Example 4 of Embodiment 1 of the present disclosure. Although the laser diode chip 10, the submount 20, and the collimating lens 30 are shown isolated in FIG. 6A, they are actually bonded to one another. FIG. 6B is a top plan view schematically showing the laser light source 140 in FIG. 6A. FIG. 6C is a cross-sectional view of the configuration of FIG. 6B taken along line VIC-VIC, which is parallel to the YZ plane. The laser light source 140 according to Modified Example 4 of Embodiment 1 differs from the laser light source 100 according to Embodiment 1 in the configuration of the submount 20. The submount 20 according to Modified Example 4 of Embodiment 1 defines a through-hole 20h extending from the principal surface $20s_1$ and reaching the back surface $20s_2$ and includes a metal 20m filling the through-hole 20h. A portion of the submount 20 other than the through-hole 20h may be made of, for example, a ceramic. The metal 20m has a high thermal conductivity, and may contain at least one selected from the group consisting of Cu, Al, Ag, Fe, Ni, Mo, Cu, W, and CuMo, for example. The metal 20m has a largest size along the X direction of e.g. 0.5 mm or greater and 1.5 mm or less, and a largest size along the Z direction of e.g. 1 mm or greater and 6 mm or less. In a top plan view, a whole or a portion of the metal 20m may overlap the laser diode chip 10. With the laser diode chip 10 disposed in contact with the metal 20m of the submount 20, the heat generated from the laser diode chip 10 can be efficiently transmitted to the semiconductor laser package 40 via the metal 20m.

Figure 7A:
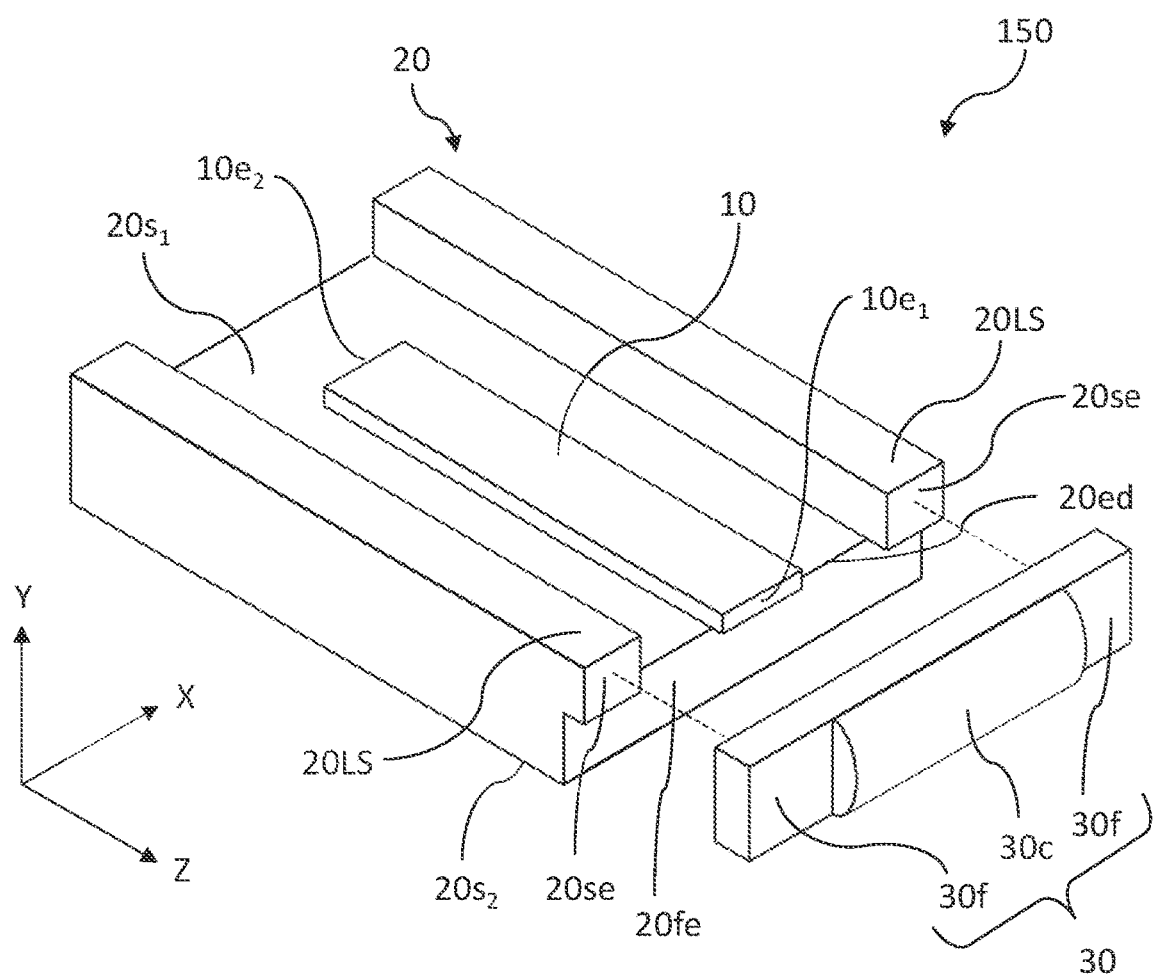
FIG. 7A is a perspective view schematically showing an example of a configuration of a laser light source 150 according to Modified Example 5 of Embodiment 1 of the present disclosure.
Figure 7B:
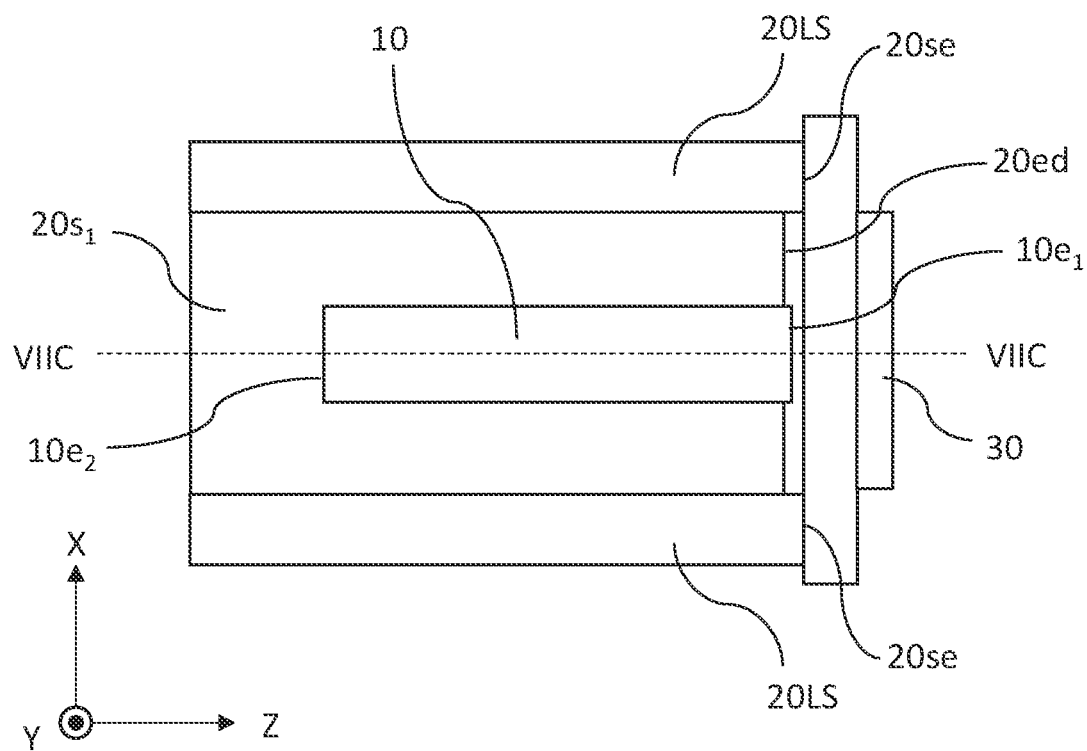
FIG. 7B is a top plan view schematically showing the laser light source 150 in FIG. 7A.
Figure 7C:
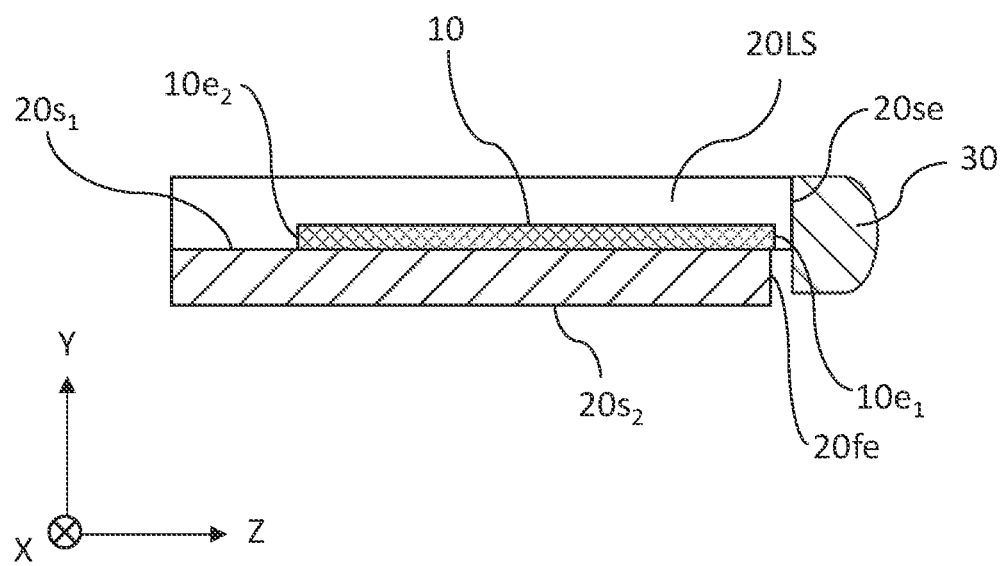
FIG. 7C is a cross-sectional view of the configuration of FIG. 7B taken along line VIIC-VIIC, which is parallel to the YZ plane.

Next, with reference to FIG. 7A to FIG. 7C, an example of a configuration of a laser light source 150 according to Modified Example 5 of Embodiment 1 of the present disclosure will be described. FIG. 7A is a perspective view schematically showing an example of a configuration of the laser light source 150 according to Modified Example 5 of Embodiment 1 of the present disclosure. FIG. 7B is a top plan view schematically showing the laser light source 150 in FIG. 7A. FIG. 7C is a cross-sectional view of the configuration of FIG. 7B taken along line VIIC-VIIC, which is parallel to the YZ plane. The laser light source 150 according to Modified Example 5 of Embodiment 1 differs from the laser light source 100 according to Embodiment 1 in the shape of the collimating lens 30. The collimating lens 30 according to Modified Example 5 of Embodiment 1 includes a pair of flat portions 30f and a lens curved-surface portion 30c located between the pair of flat portions 30f. Similarly to the collimating lens 30 according to Embodiment 1, the lens curved-surface portion 30c according to Modified Example 5 of Embodiment 1 functions as an FAC lens.

Figure 7D:
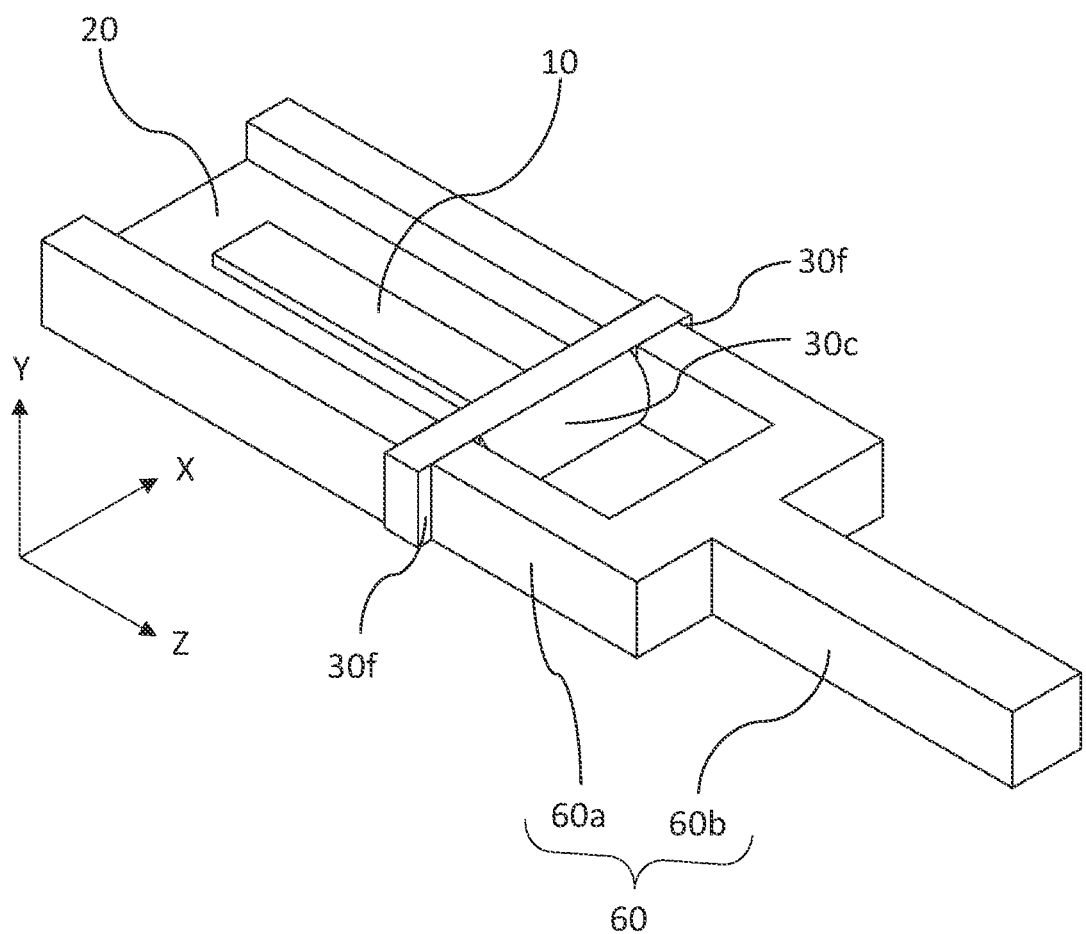
FIG. 7D is a perspective view schematically showing a collimating lens 30 of the laser light source 150 in FIG. 7A being bonded to a submount 20 using a collet 60.

Next, with reference to FIG. 7D, an advantage associated with the pair of flat portions 30f of the collimating lens 30 will be described. FIG. 7D is a perspective view schematically showing the collimating lens 30 of the laser light source 150 in FIG. 7A being bonded to the submount 20 using a collet 60. The collet 60 includes fork portions 60a and a support portion 60b that is connected to the fork portions 60a. The collet 60 has a hollow structure, and is able to suck the collimating lens 30 and support it. Specifically, the pair of flat portions 30f of the collimating lens 30 are sucked onto tip portions of the fork portions 60a of the collet 60. The support portion 60b is held by a mounting apparatus, and while the collimating lens 30 is supported by the fork portions 60a, the collimating lens 30 may be bonded to the submount 20, which allows for stably applying a load in a direction perpendicular to the end surfaces 20se of the pair of lens supports 20LS. With the load applied, the bonding material existing between the collimating lens 30 and the end surfaces 20se of the pair of lens supports 20LS is heated.

A mirror (not shown) may be provided between the fork portions 60a of the collet 60. While laser light is allowed to be emitted from the laser diode chip 10 in the Z direction, the collimating lens 30 is bonded to the submount 20, and laser light that is reflected at the mirror (not shown) along the Y direction may be received by a photodetection device, so that alignment between the collimating lens 30 and the emission end surface $10e_1$ of the laser diode chip 10 can be accurately performed. The photodetection device may be a power meter, a parallelism meter, or a beam profiler, for example.

Embodiment 2

Next, with reference to FIG. 8A to FIG. 8D, an example of a fundamental configuration of a laser light source according to Embodiment 2 of the present disclosure will be described.

Figure 8A:
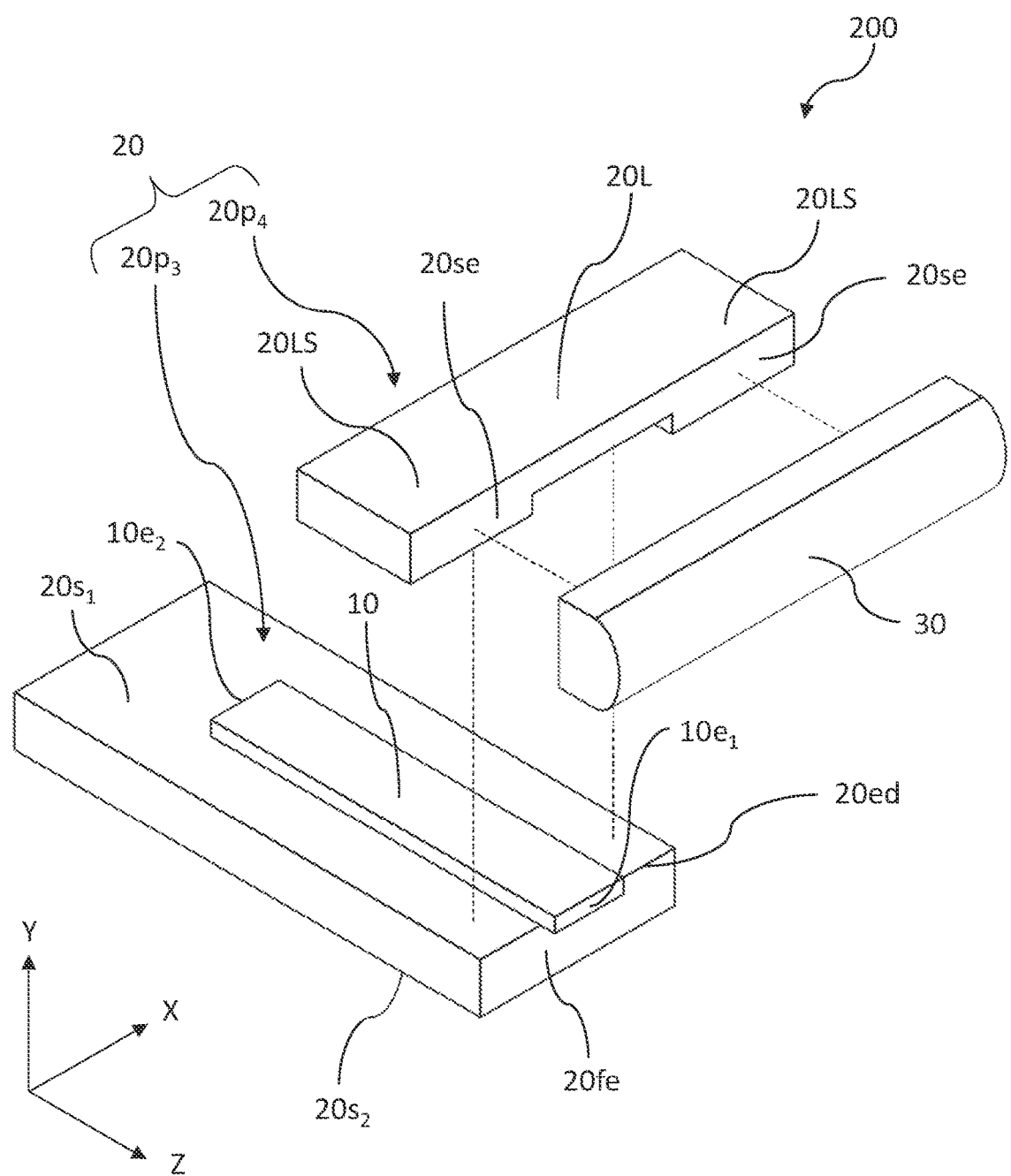
FIG. 8A is a perspective view schematically showing an example of a configuration of a laser light source 200 according to Embodiment 2 of the present disclosure.
Figure 8B:
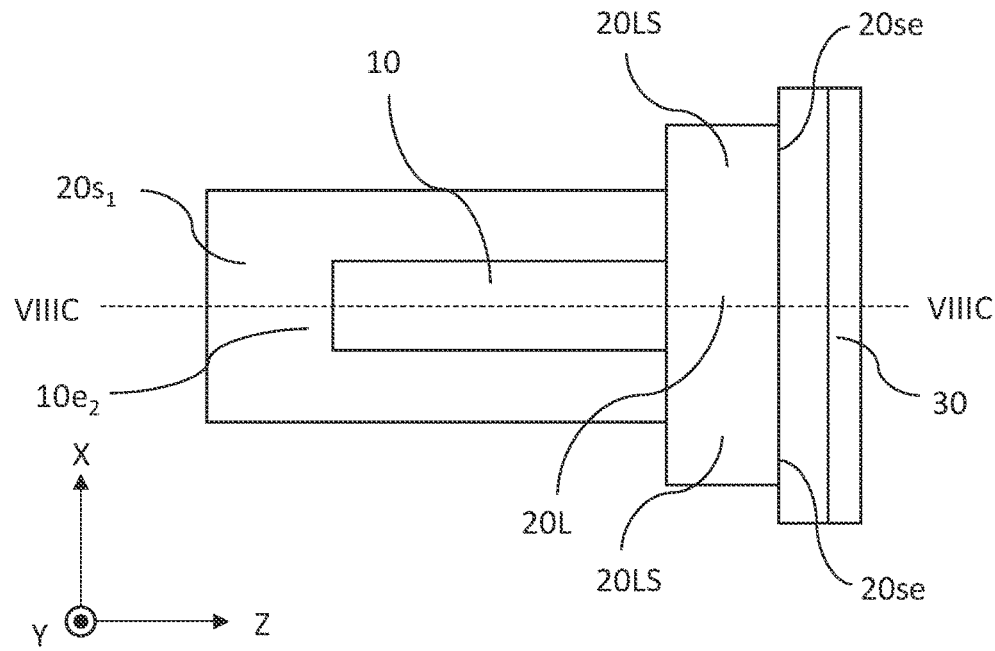
FIG. 8B is a top plan view schematically the laser light source 200 in FIG. 8A.
Figure 8C:
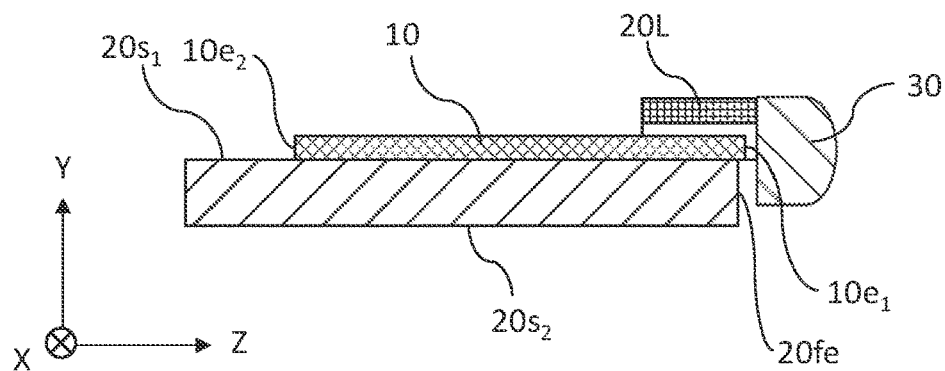
FIG. 8C is a cross-sectional view of the configuration of FIG. 8B taken along line VIIIC-VIIIC, which is parallel to the YZ plane.
Figure 8D:
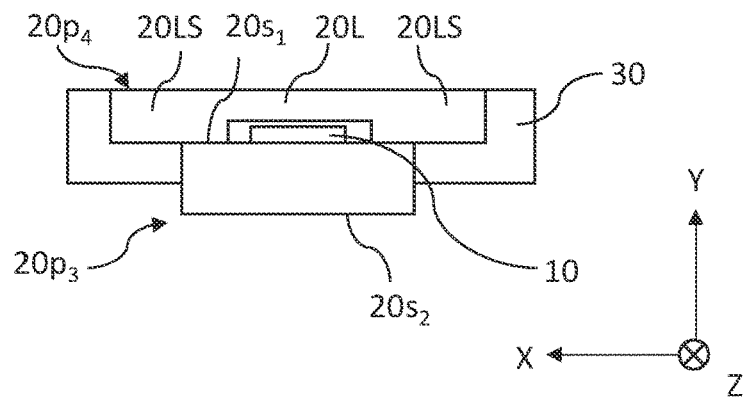
FIG. 8D is a rear view schematically showing the laser light source 200 in FIG. 8A.

FIG. 8A is a perspective view schematically showing an example of a configuration of a laser light source 200 according to Embodiment 2 of the present disclosure. FIG. 8B is a top plan view schematically showing the laser light source 200 in FIG. 8A. FIG. 8C is a cross-sectional view of the configuration of FIG. 8B taken along line VIIIC-VIIIC, which is parallel to the YZ plane. FIG. 8D is a rear view schematically showing the laser light source 200 in FIG. 8A. The laser light source 200 according to Embodiment 2 differs from the laser light source 100 according to Embodiment 1 in the configuration of the submount 20. The submount 20 according to Embodiment 2 includes a third submount portion $20p_3$ and a fourth submount portion $20p_4$. The third submount portion $20p_3$ includes a principal surface $20s_1$, a back surface $20s_2$, and a front end surface 20fe. The fourth submount portion $20p_4$ includes: a pair of lens supports 20LS that are fixed to the principal surface $20s_1$ of the third submount portion $20p_3$; and a connecting portion 20L that connects together the pair of lens supports 20LS. The connecting portion 20L connects the pair of lens supports 20LS without hindering propagation of laser light emitted from the emission end surface $10e_1$ of the laser diode chip 10. In this submount 20, the third submount portion $20p_3$ and the fourth submount portion $20p_4$ are separate pieces. As in this example, the submount 20 may include a portion having the principal surface $20s_1$ and a portion having the pair of lens supports 20LS, these portions being separate pieces. Although the third submount portion $20p_3$, the fourth submount portion $20p_4$, and the collimating lens 30 are shown isolated in FIG. 8A, they are actually bonded to one another. The pair of lens supports 20LS and the connecting portion 20L of the fourth submount portion $20p_4$ are monolithically molded.

As shown in FIG. 8B and FIG. 8C, in a top plan view, the connecting portion 20L overlaps the emission end surface $10e_1$ of the laser diode chip 10. As shown in FIG. 8D, the fourth submount portion $20p_4$ is disposed on the principal surface $20s_1$ of the third submount portion $20p_3$ over the laser diode chip 10. With the size of the fourth submount portion $20p_4$ along the X direction being larger than the size of the third submount portion $20p_3$ along the X direction, the area of the end surfaces 20se of the pair of lens supports 20LS can be increased. This allows for facilitating bonding of the collimating lens 30 onto the end surfaces 20se of the pair of lens supports 20LS. The size of the pair of lens supports 20LS of the fourth submount portion $20p_4$ along the Y direction may be approximately the same as the size of the collimating lens 30 along the Y direction. The size of the pair of lens supports 20LS of the fourth submount portion $20p_4$ along the Y direction may be greater than, equal to, or smaller than the size of the collimating lens 30 along the Y direction. The fourth submount portion $20p_4$ may have a size along the X direction of e.g. 0.5 mm or greater and 4 mm or less, the largest size along the Y direction of e.g. 0.5 mm or greater and 2 mm or less, and a size along the Z direction of e.g. 0.5 mm or greater and 1 mm or less.

In the production of the laser light source 200 according to Embodiment 2, a step of bonding the laser diode chip 10 to the principal surface $20s_1$ of the third submount portion $20p_3$, a step of bonding the fourth submount portion $20p_4$ to the principal surface $20s_1$ of the third submount portion $20p_3$ over the laser diode chip 10, and a step of bonding the collimating lens 30 to the end surfaces 20se of the pair of lens supports 20LS of the fourth submount portion $20p_4$ may be performed in this order. Alternatively, the fourth submount portion $20p_4$ with the collimating lens 30 bonded thereto may be bonded onto the third submount portion $20p_3$ with the laser diode chip 10 bonded to its principal surface $20s_1$.

In the laser light source 200 according to Embodiment 2, as in the laser light source 100 according to Embodiment 1, the submount 20 supports the laser diode chip 10 on the principal surface $20s_1$ between the pair of lens supports 20LS, and supports the collimating lens 30 on the end surfaces 20se of the pair of lens supports 20LS. This allows for facilitating alignment between the laser diode chip 10 and the collimating lens 30, and allows for obtaining the laser light source 200 of a small size. Furthermore, in the laser light source 200 according to Embodiment 2, as in the laser light source 100 according to Embodiment 1, even when the laser diode chip 10 is disposed on the submount 20 in a face-down state, climbing-up of the bonding material onto the emission end surface $10e_1$ of the laser diode chip 10 can be reduced.

Modified Examples of Embodiment 2

Next, Modified Example 1 and Modified Example 2 of the laser light source 200 according to Embodiment 2 of the present disclosure will be described. Descriptions repetitive of the description above may be omitted.

Figure 9A:
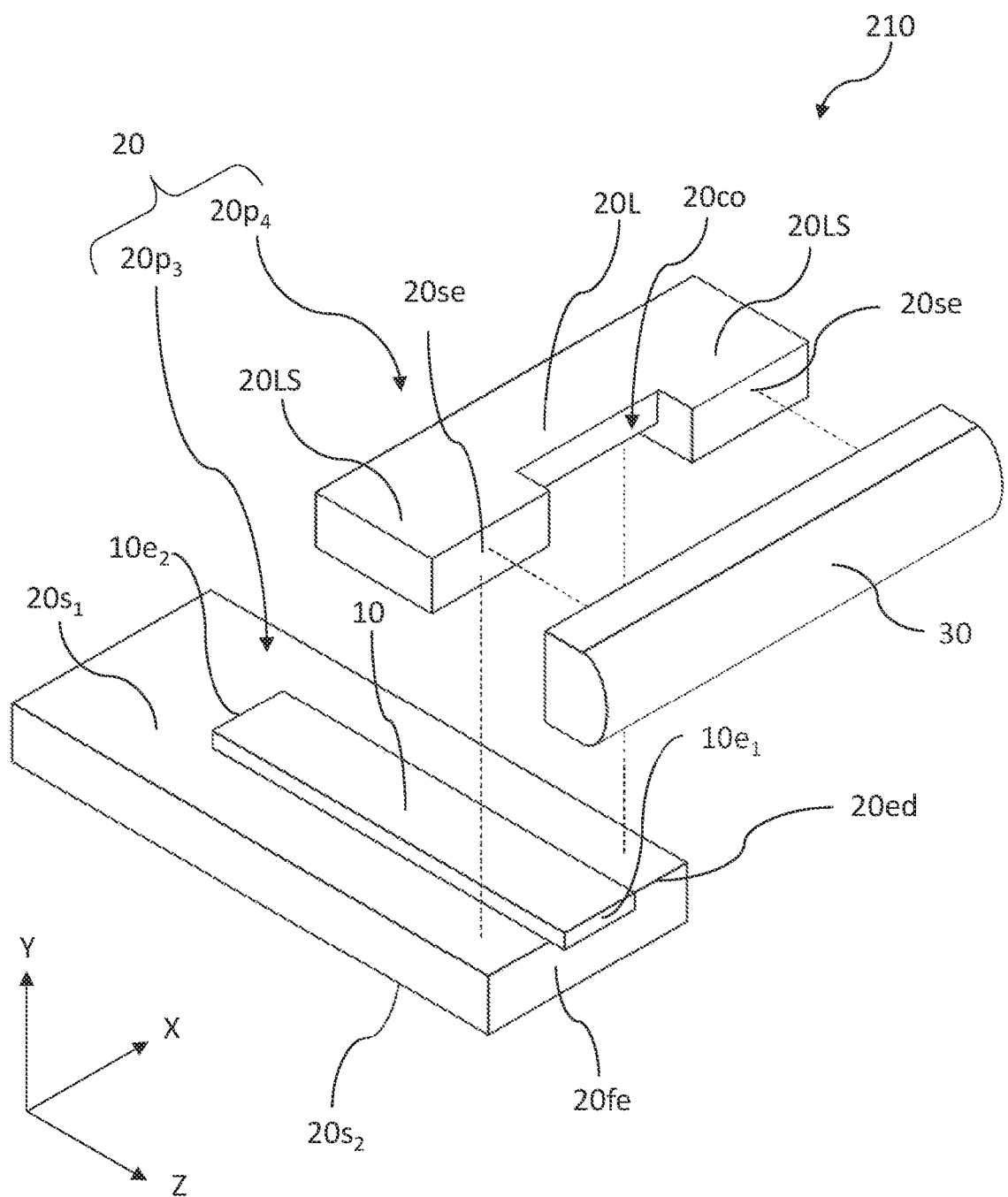
FIG. 9A is a perspective view schematically showing an example of a configuration of a laser light source 210 according to Modified Example 1 of Embodiment 2 of the present disclosure.
Figure 9B:
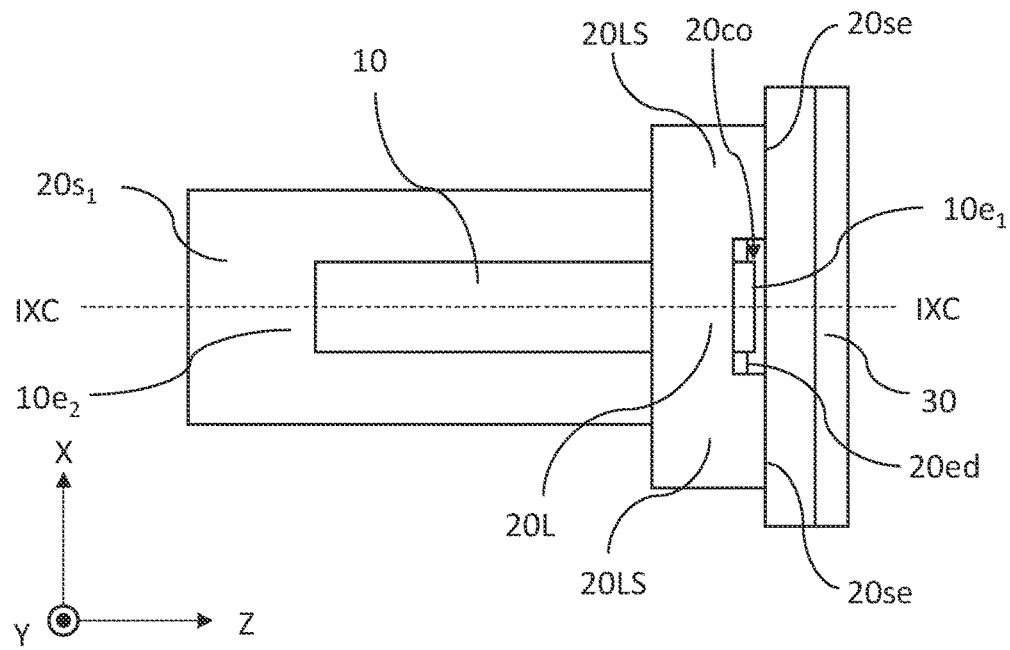
FIG. 9B is a top plan view schematically showing the laser light source 210 in FIG. 9A.
Figure 9C:
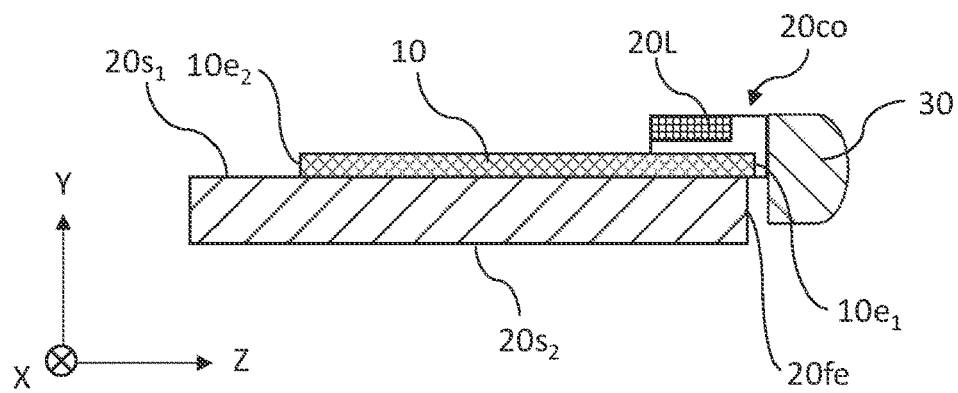
FIG. 9C is a cross-sectional view of the configuration of FIG. 9B taken along line IXC-IXC, which is parallel to the YZ plane.
Figure 9D:
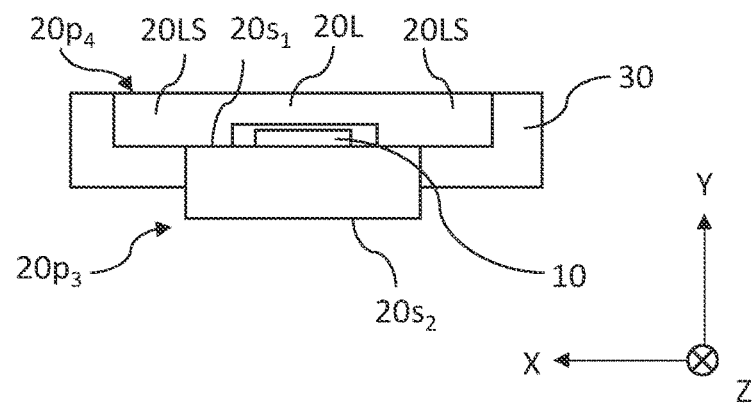
FIG. 9D is a rear view schematically showing the laser light source 210 in FIG. 9A.

With reference to FIG. 9A to FIG. 9D, an example of a configuration of a laser light source 210 according to Modified Example 1 of Embodiment 2 of the present disclosure will be described. FIG. 9A is a perspective view schematically showing an example of a configuration of the laser light source 210 according to Modified Example 1 of Embodiment 2 of the present disclosure. FIG. 9B is a top plan view schematically showing the laser light source 210 in FIG. 9A. FIG. 9C is a cross-sectional view of the configuration of FIG. 9B taken along line IXC-IXC, which is parallel to the YZ plane. FIG. 9D is a rear view schematically showing the laser light source 210 in FIG. 9A. The laser light source 210 according to Modified Example 1 of Embodiment 2 differs from the laser light source 200 according to Embodiment 2 in the shape of the fourth submount portion $20p_4$ of the submount 20. The fourth submount portion $20p_4$ according to Modified Example 1 of Embodiment 2 defines a recess 20co between the pair of lens supports 20LS, in the fourth submount portion $20p_4$ according to Embodiment 2. As shown in FIG. 9B and FIG. 9C, with the recess 20co, the connecting portion 20L does not overlap the emission end surface $10e_1$ of the laser diode chip 10 in a top plan view. The recess 20co has a size along the X direction of e.g. 0.2 mm or greater and 3 mm or less, and a size along the Z direction of e.g. 0.5 mm or greater and 1 mm or less. The size of the recess 20co along the Z direction is larger than the distance between the end surface 20se of each of the pair of lens supports 20LS and the edge 20ed of the principal surface $20s_1$ of the third submount portion $20p_3$ along the Z direction. In the production of the laser light source 210 according to Modified Example 1 of Embodiment 2, the recess 20co allows for facilitating alignment between the emission end surface $10e_1$ of the laser diode chip 10 and the fourth submount portion $20p_4$ and alignment between the emission end surface $10e_1$ of the laser diode chip 10 and the collimating lens 30.

Figure 10A:
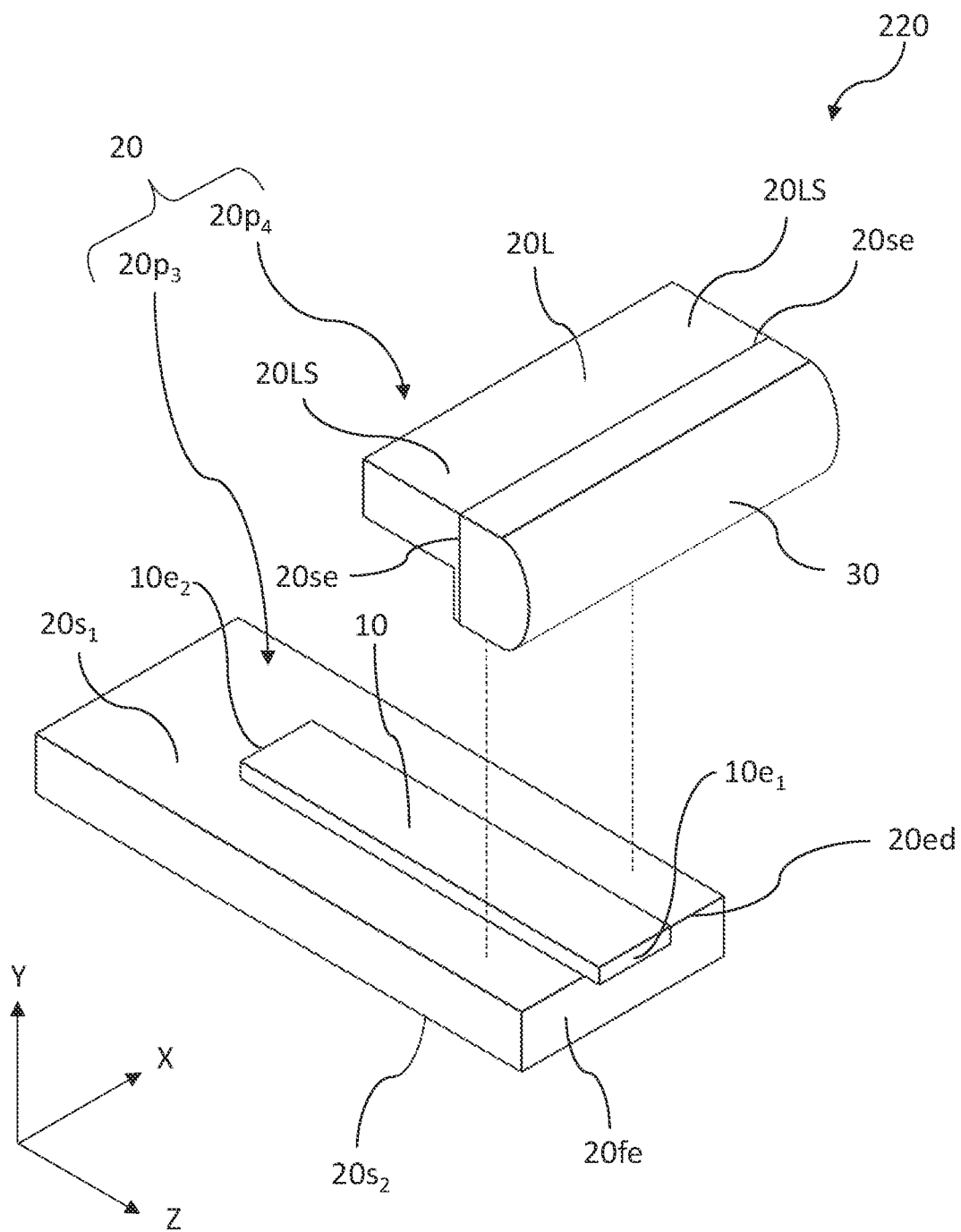
FIG. 10A is a perspective view schematically showing an example of a configuration of a laser light source 220 according to Modified Example 2 of Embodiment 2 of the present disclosure.
Figure 10B:
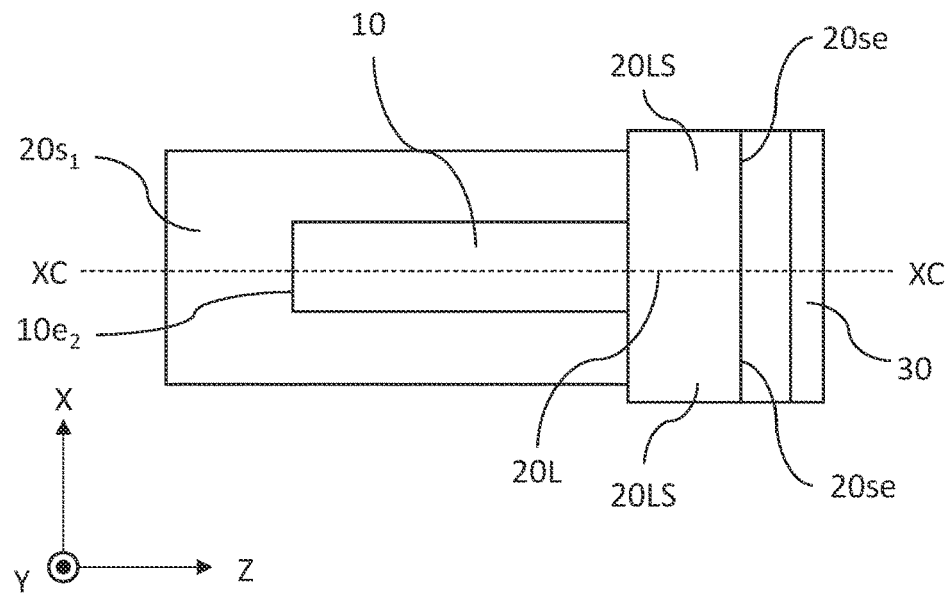
FIG. 10B is a top plan view schematically showing the laser light source 220 in FIG. 10A.
Figure 10C:
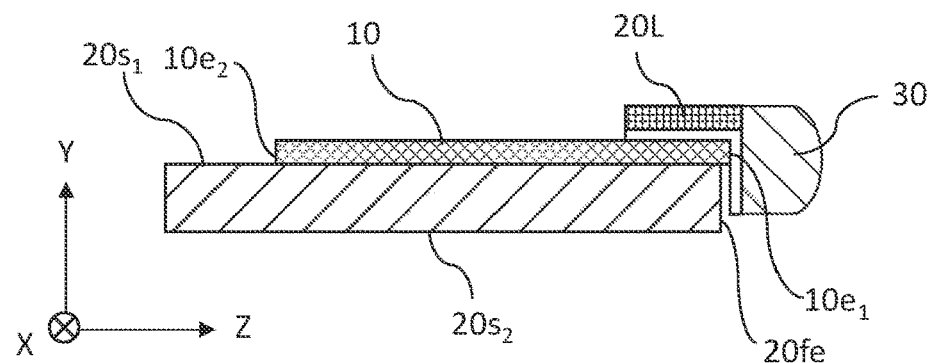
FIG. 10C is a cross-sectional view of the configuration of FIG. 10B taken along line XC-XC, which is parallel to the YZ plane.
Figure 10D:
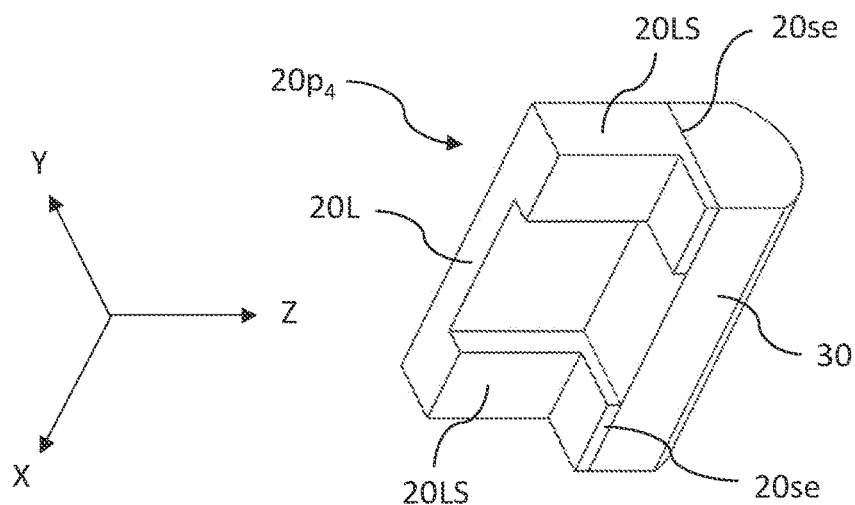
FIG. 10D is a perspective view schematically showing a fourth submount portion $20p_4$ and a collimating lens 30 in FIG. 10A.

Next, with reference to FIG. 10A to FIG. 10D, an example of a configuration of a laser light source 220 according to Modified Example 2 of Embodiment 2 of the present disclosure will be described. FIG. 10A is a perspective view schematically showing an example of a configuration of the laser light source 220 according to Modified Example 2 of Embodiment 2 of the present disclosure. FIG. 10B is a top plan view schematically showing the laser light source 220 in FIG. 10A. FIG. 10C is a cross-sectional view of the configuration of FIG. 10B taken along line XC-XC, which is parallel to the YZ plane. FIG. 10D is a perspective view schematically showing the fourth submount portion $20p_4$ and the collimating lens 30 shown in FIG. 10A. The laser light source 220 according to Modified Example 2 of Embodiment 2 differs from the laser light source 200 according to Embodiment 2 in the fourth submount portion $20p_4$ of the submount 20 and the collimating lens 30. As shown in FIG. 10D, according to Modified Example 2 of Embodiment 2, the fourth submount portion $20p_4$ of the submount 20 and the collimating lens 30 are monolithically molded. The fourth submount portion $20p_4$ and the collimating lens 30 do not need to be bonded to each other, so that the size of the fourth submount portion $20p_4$ according to Modified Example 2 of Embodiment 2 along the X direction does not need to be as large as the size of the fourth submount portion $20p_4$ according to Embodiment 2 along the X direction. The fourth submount portion $20p_4$ according to Modified Example 2 of Embodiment 2 has a size along the X direction of e.g. 0.2 mm or greater and 3 mm or less, the largest size along the Y direction of e.g. 0.3 mm or greater and 1 mm or less, and a size along the Z direction of e.g. 0.5 mm or greater and 1 mm or less.

The fourth submount portion $20p_4$ and the collimating lens 30 that are monolithically molded may be made of, for example, at least one of glass, quartz, synthetic quartz, sapphire, transparent ceramics, and plastics. When the fourth submount portion $20p_4$ and the collimating lens 30 that are monolithically molded are transparent, alignment between the emission end surface $10e_1$ of the laser diode chip 10 and the collimating lens 30 can be facilitated.

Components in the embodiments described above and components in Modified Examples thereof may be combined in any appropriate manners.

APPLICATION EXAMPLES

A laser light source according to the present disclosure can be used for light sources for a direct diode laser that combines a plurality of laser beams for an enhanced output power, for example. Combining of beams are to be performed by accurately combining laser beams that are emitted from a plurality of laser light sources. With a high-intensity laser beam having a wavelength of 570 nm or less, even a metal such as copper can be easily processed. In a laser light source according to the present disclosure, a misalignment between a laser diode chip and a lens is unlikely to occur; therefore, the optical axis of the laser light that is emitted to the outside from the laser light source will not be greatly misoriented. This allows for accurately combining laser beams that are emitted from a plurality of such laser light sources, which allows for increasing beam quality.

INDUSTRIAL APPLICABILITY

A laser light source according to the present disclosure can also be used for, for example, projectors and illumination devices.

REFERENCE SIGNS LIST 10 laser diode chip
10a semiconductor multilayer structure
10b substrate
$10C_1$ first cladding layer
$10C_2$ second cladding layer
$10e_1$ emission end surface
$10e_2$ rear end surface
10L emission layer
20 submount
20co recess
20d groove
20ed edge
20fe front end surface
$20fe_1$ central end surface
$20fe_2$ side end surface
20L connecting portion
20LS lens support
$20p_1$ first submount portion
$20p_2$ second submount portion
$20p_3$ third submount portion
$20p_4$ fourth submount portion
$20s_1$ principal surface
$20s_2$ back surface
20se end surfaces of a pair of lens supports
20us upper surface of first submount portion
30 collimating lens
30c lens curved-surface portion
30f flat portion
40 semiconductor laser package
40b base
40L lid
40w light-transmitting window
50 lead terminal
60 collet
60a fork portion
60b support portion
100, 110, 120, 130, 140, 150 laser light source
200, 210, 220 laser light source

The invention claimed is:

1. A laser light source comprising:
an edge-emitting type laser diode chip that comprises:
   a semiconductor multilayer structure comprising an emission layer, and
   a substrate supporting the semiconductor multilayer structure, wherein:
   the laser diode chip has a first end surface through which laser light generated in the emission layer is emitted, and a second end surface opposite to the first end surface, and a distance from the first end surface to the second end surface defines a cavity length;
a submount having a principal surface on which the laser diode chip is fixed, and a back surface located opposite to the principal surface, the submount comprising a pair of lens supports located at opposite sides with respect to the first end surface of the laser diode chip;
a lens bonded to end surfaces of the pair of lens supports; and
a semiconductor laser package housing the laser diode chip, the lens, and the submount; wherein:
the laser diode chip is fixed to the submount such that a distance from the emission layer to the submount is less than a distance from the substrate to the submount;
the first end surface of the laser diode chip is located outward in a direction along the cavity length with respect to an edge of the principal surface;
the end surfaces of the pair of lens supports are located outward with respect to the first end surface of the laser diode chip in the direction along the cavity length;
the submount further comprises a connecting portion connecting the pair of lens supports without hindering propagation of the laser light emitted from the first end surface of the laser diode chip, wherein the pair of lens supports and the connecting portion are monolithic; and
in a top plan view, the connecting portion overlaps the first end surface of the laser diode chip.

2. The laser light source of claim 1, wherein:
the semiconductor laser package comprises a base that is in thermal contact with the back surface of the submount; and
the semiconductor laser package hermetically seals the laser diode chip, the submount, and the lens.

3. The laser light source of claim 1, wherein:
the submount has a front end surface connecting the principal surface and the back surface;

the front end surface has a central end surface and side end surfaces that are located on opposite sides of the central end surface;

the central end surface is recessed with respect to the side end surfaces in the direction along the cavity length; and the edge of the principal surface is defined by the principal surface and the central end surface of the submount.

4. The laser light source of claim 1, wherein the submount includes a groove extending in the direction along the cavity length between each of the pair of lens supports and the laser diode chip.

5. The laser light source of claim 1, wherein the lens is bonded to the end surfaces of the pair of lens supports via an inorganic material.

6. The laser light source of claim 1, wherein a portion or an entirety of the submount is made of a ceramic.

7. The laser light source of claim 6, wherein the submount includes a through-hole extending from the principal surface and reaching the back surface, and a metal filling the through-hole.

8. The laser light source of claim 1, wherein, when viewed in the direction along the cavity length, a centroid of the lens is located between the pair of lens supports.

9. The laser light source of claim 1, wherein the laser light has a wavelength of 350 nm or more and 570 nm or less.

10. The laser light source claim 1, wherein:

the lens has a structure elongated along a direction that is perpendicular to a normal direction of the principal surface and to the direction along the cavity length; and the lens reduces a divergence angle of the laser light within a plane extending in the normal direction of the principal surface and in the direction along the cavity length.

11. The laser light source of claim 1, wherein the lens includes a pair of flat portions and a lens curved-surface portion located between the pair of flat portions.

12. The laser light source of claim 1, wherein the pair of lens supports, the connecting portion, and the lens are monolithic.

13. The laser light source of claim 1, wherein:

the submount comprises a submount portion comprising the principal surface, and another submount portion comprising the pair of lens supports; and the submount portion and the other submount portion are separate pieces.

14. The laser light source of claim 1, wherein the lens and the end surfaces of the pair of lens supports are bonded via a bonding material.

* * * * *